United States Patent
Harrington, III

(10) Patent No.: US 9,837,358 B2
(45) Date of Patent: Dec. 5, 2017

(54) SOURCE-GATE REGION ARCHITECTURE IN A VERTICAL POWER SEMICONDUCTOR DEVICE

(71) Applicant: D3 Semiconductor LLC, Addison, TX (US)

(72) Inventor: Thomas E. Harrington, III, Carrollton, TX (US)

(73) Assignee: D3 Semiconductor LLC, Addison, TX (US)

( * ) Notice: Subject to any disclaimer, the term of this patent is extended or adjusted under 35 U.S.C. 154(b) by 0 days.

(21) Appl. No.: 15/008,997

(22) Filed: Jan. 28, 2016

(65) Prior Publication Data

US 2017/0098609 A1    Apr. 6, 2017

Related U.S. Application Data

(60) Provisional application No. 62/236,009, filed on Oct. 1, 2015.

(51) Int. Cl.
*H01L 23/535* (2006.01)
*H01L 21/285* (2006.01)
(Continued)

(52) U.S. Cl.
CPC ...... *H01L 23/535* (2013.01); *H01L 21/28518* (2013.01); *H01L 21/76805* (2013.01); *H01L 21/76843* (2013.01); *H01L 21/76889* (2013.01); *H01L 21/76895* (2013.01); *H01L 23/53266* (2013.01); *H01L 29/0623* (2013.01); *H01L 29/0634* (2013.01); *H01L 29/0696* (2013.01); *H01L 29/1095* (2013.01);
(Continued)

(58) Field of Classification Search
None
See application file for complete search history.

(56) References Cited

U.S. PATENT DOCUMENTS 4,383,268 A    5/1983 Martinelli et al.
4,753,709 A    6/1988 Welch et al.
(Continued)

OTHER PUBLICATIONS

Wolf, "Silicon Processing for the VLSI Era—vol. 2: Process Integration," 1990, Lattice Press, vol. 2, p. 176-181.*

(Continued)

*Primary Examiner* — Angel Roman
*Assistant Examiner* — Kevin Quinto
(74) *Attorney, Agent, or Firm* — Carrington, Coleman, Sloman & Blumenthal, L.L.P.

(57) ABSTRACT

A vertical drift metal-oxide-semiconductor (VDMOS) transistor with improved contact to source and body regions, and a method of fabricating the same. A masked ion implant of the source regions into opposite-type body regions defines the locations of body contact regions, which are implanted subsequently with a blanket implant. The surface of the source regions and body contact regions are silicide clad, and an overlying insulator layer deposited and planarized. Contact openings are formed through the planarized insulator layer, within which conductive plugs are formed to contact the metal silicide, and thus the source and body regions of the device. A metal conductor is formed overall to the desired thickness, and contacts the conductive plugs to provide bias to the source and body regions.

18 Claims, 17 Drawing Sheets

(51) Int. Cl.
  *H01L 21/768*  (2006.01)
  *H01L 23/532*  (2006.01)
  *H01L 29/06*   (2006.01)
  *H01L 29/10*   (2006.01)
  *H01L 29/66*   (2006.01)
  *H01L 29/739*  (2006.01)
  *H01L 29/78*   (2006.01)

(52) U.S. Cl.
  CPC .. *H01L 29/66333* (2013.01); *H01L 29/66712* (2013.01); *H01L 29/7395* (2013.01); *H01L 29/7811* (2013.01)

(56) References Cited

U.S. PATENT DOCUMENTS

| | | | |
|---|---|---|---|
| 4,960,732 A * | 10/1990 | Dixit | H01L 21/76843 257/753 |
| 5,173,450 A | 12/1992 | Wei | |
| 5,234,851 A * | 8/1993 | Korman | H01L 29/66333 257/24 |
| 5,578,851 A | 11/1996 | Hshieh et al. | |
| 5,913,712 A * | 6/1999 | Molinar | B24B 37/042 451/285 |
| 6,621,122 B2 | 9/2003 | Qu | |
| 9,117,899 B2 | 8/2015 | Harrington, III et al. | |
| 2007/0013000 A1 * | 1/2007 | Shiraishi | H01L 29/0634 257/341 |
| 2014/0264343 A1 | 9/2014 | Harrington, III | |

OTHER PUBLICATIONS

U.S. Appl. No. 14/873,831, filed Oct. 2, 2015.
Rusu et al., "Gate-Controlled Diode—A New Way for Electronic Circuits", Proc. of the Romanian Academy, Series A, vol. 10, No. 3/2009 (Publishing House of the Romanian Academy, 2009), pp. 1-6.
International Search Report and Written Opinion, International Application No. PCT/US2016/15394 (ISA/US, Jun. 24, 2016).

* cited by examiner

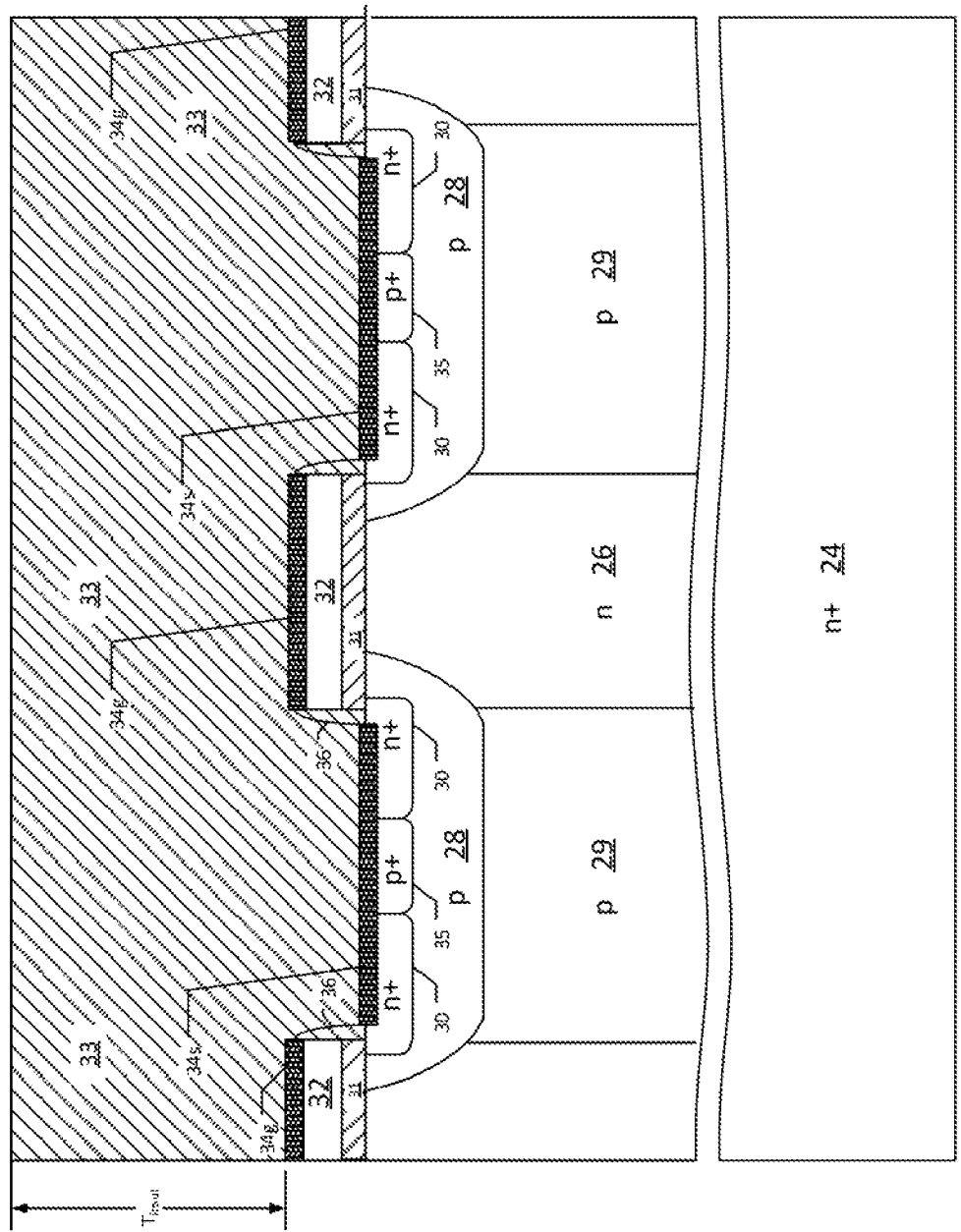

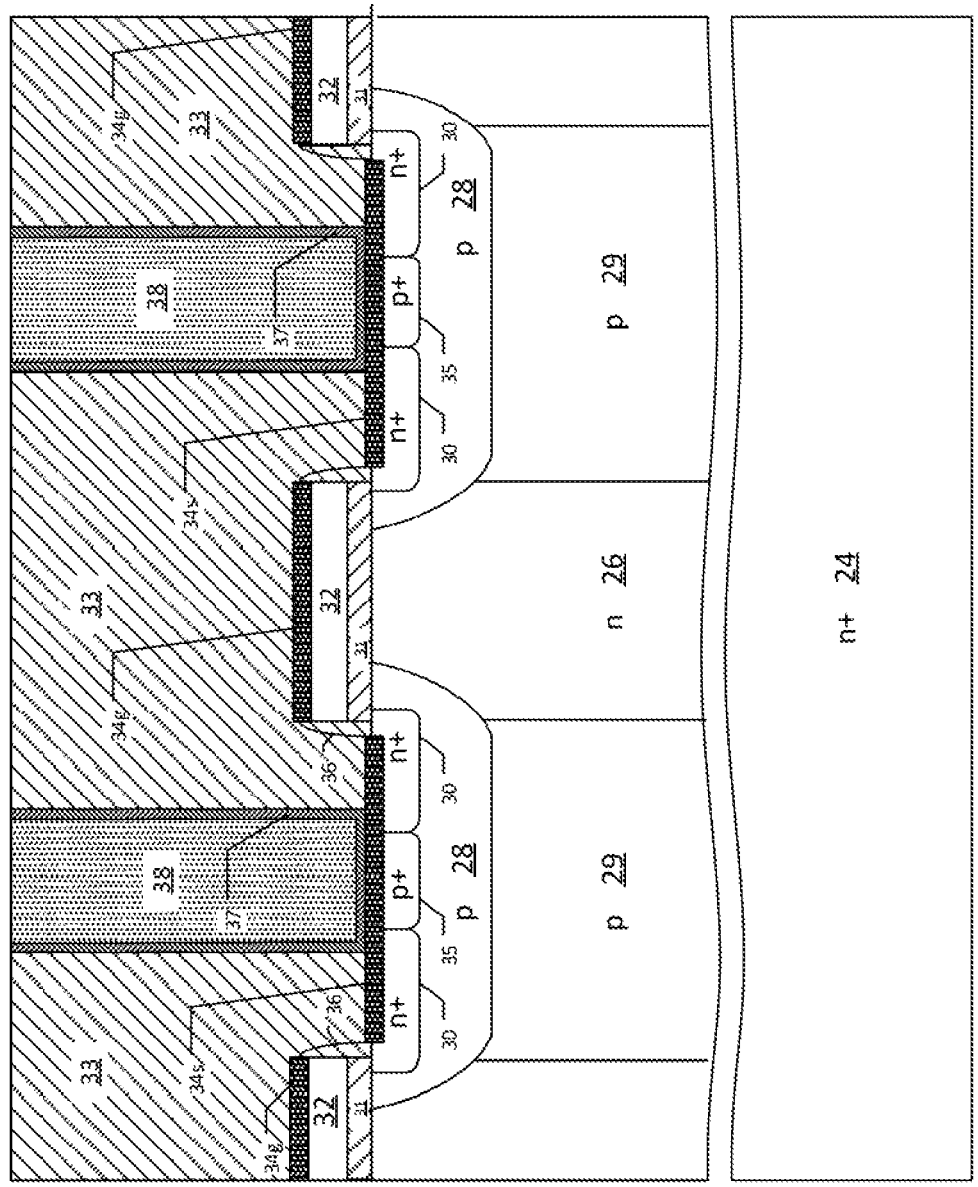

SOURCE-GATE REGION ARCHITECTURE IN A VERTICAL POWER SEMICONDUCTOR DEVICE

CROSS-REFERENCE TO RELATED APPLICATIONS

This application claims priority, under 35 U.S.C. §119(e), of Provisional Application No. 62/236,009, filed Oct. 1, 2015, incorporated herein by this reference.

STATEMENT REGARDING FEDERALLY SPONSORED RESEARCH OR DEVELOPMENT

Not applicable.

BACKGROUND OF THE INVENTION

This invention is in the field of semiconductor power devices. Disclosed embodiments are directed to the surface structure of vertical power transistors.

As known in the art, semiconductor power switching devices are ideally capable of conducting large currents with minimal voltage drop when in the on-state while blocking large reverse voltages with minimal current conduction when in the off-state, with minimal switching times and minimal switching power consumption. Improvements in manufacturing yield and reduction in manufacturing cost are also sought. Advances toward these ideal attributes have largely been made in modern power transistors through innovations in device architecture, rather than through shrinking of device features sizes as in the case of low-power semiconductor devices such as digital logic and memory devices.

Vertical power devices are now widely used in many power applications. These devices are vertical in the sense that current is conducted vertically through a drift region between the device surface and its substrate. The length of this drift region can absorb a large depletion region in the off-state and thus establish a high reverse breakdown voltage, which enables high voltage operation. Well-known types of vertical power devices include vertical drift metal-oxide-semiconductor (VDMOS) field-effect transistors, insulated gate bipolar transistors (IGBTs), and gated power diodes, all of which include a drift region sufficient to support the desired high breakdown voltage. VDMOS devices have become particularly attractive because of their fast switching speeds, and as such are particularly well-suited for implementation into switched-mode power supplies.

FIG. 1a illustrates, in cross-section, an example of the construction of a conventional n-channel vertical drift MOS transistor. VDMOS 2 of FIG. 1a has a drain terminal at n+ substrate 4, and a drift region provided by n-type epitaxial layer 6, which overlies substrate 4 and extends to the surface of the device as shown. P-type body regions 8 at the surface of n-type epitaxial layer 6 serve as the VDMOS body region, within which one or more n+ regions 10 serve as the source of VDMOS 2. Gate dielectric 11 and gate electrode 12 overlie portions of p-type body regions 8 between source region 10 and the drain at n-type epitaxial layer 6. Bias is supplied to n+ source regions 10 and p-type body regions 8 (typically at p+ contact regions, not shown), so that the body node of VDMOS 2 is biased at the source potential. Other conductors (not shown) contact gate electrode 12 and substrate 4 to provide gate and drain bias, respectively. As in any n-channel MOS transistor, vertical power VDMOS 2 is biased into the on-state by a voltage at gate electrode 12 that exceeds the transistor threshold voltage, in combination with a sufficient drain-to-source bias. The drain-to-source bias in typical power applications is typically very high (e.g., as high as from several hundred to over one thousand volts). As shown in FIG. 1a, on-state source-drain current Ids conducts from source regions 10 laterally along an inversion layer in the body region of p-type body regions 8, and vertically through epitaxial layer 6 into substrate 4 at the transistor drain. The on-resistance of VDMOS 2 includes the channel resistance $R_{ch}$ in p-type body regions 8, but is typically dominated by the resistance $R_{epi}$ of n-type epitaxial layer 6 because of the thickness and relatively light dopant concentration of that layer. While an increase in the doping concentration of epitaxial layer 6 would reduce resistance $R_{epi}$ and thus reduce the overall on-resistance of VDMOS 2, the breakdown voltage of VDMOS 2 is directly related to the thickness of its n-type epitaxial layer 6 (i.e., the VDMOS "drift" length), and is inversely related to the dopant concentration of the more lightly-doped epitaxial layer 6. Because typical VDMOS devices must withstand high drain-to-source voltages (e.g., on the order of hundreds of volts) in the off-state, a tradeoff between on-resistance and off-state breakdown voltage is required.

Also as known in the art, "superjunction" VDMOS transistors address this tradeoff. FIG. 1b illustrates an example of such a conventional superjunction VDMOS 2', also for the case of an n-channel device. Superjunction VDMOS 2' is constructed similarly as non-superjunction VDMOS 2 of FIG. 1a insofar as the surface structures (p-type body regions 8, n+ source regions 10, gate electrode 12, etc.) are concerned. However, in contrast to the non-superjunction VDMOS 2 of FIG. 1a, the epitaxial region of superjunction VDMOS 2' is filled with p-type doped "pillars" 9 formed into epitaxial layer 6'. These p-type pillars 9 may be constructed by ion implantation during the formation of epitaxial layer 6' silicon, for example in a multiple step epitaxial process in which a p-type pillar implant is performed after epitaxy of a portion of layer 6', such that each pillar 9 is formed as a number of vertically aligned segments. P-type body regions 8 and n+ source regions 10 are typically self-aligned with gate electrode 12, with p-type body regions 8 typically implanted prior to the n+ source implant, and receiving a dedicated drive-in anneal, so as to extend farther under gate electrode 12 than its corresponding n+ source region 10, with p-type body regions 8 typically extending slightly into the surface region of the n-type epitaxial region. The dopant concentration of p-type body regions 8 is optimized for the desired MOSFET characteristics, such as threshold voltage and punch-through, while the dopant concentration of p-type pillars 9 is optimized for charge balance in the off-state, and will typically be more lightly doped than body regions 8. In the on-state, VDMOS 2' conducts source-drain current Ids in the same manner as described above for non-superjunction VDMOS 2, in this case with current conducted through the n-type drift regions presented by the portions of n-type epitaxial layer 6' between p-type pillars 9. In the off-state, however, p-type pillars 9 and the n-type drift regions of epitaxial layer 6' will essentially fully deplete under the typical high drain-to-source voltage, in which case the additional p-type material of pillars 9 extending deep into the structure causes a corresponding amount of charge to also deplete from n-type epitaxial layer 6', in order to attain charge balance. This additional charge cancellation in the off-state resulting from pillars 9 according to this superjunction construction enables epitaxial layer 6' to have a higher dopant concentration, and thus a lower on-state resistance $R_{epi}$, without adversely affecting the breakdown voltage in the off-state.

The gate electrodes in the conventional VDMOS devices of FIGS. 1a and 1b are planar structures, disposed near the surface of the semiconductor and overlying the gate dielectric layer. In contrast, some conventional superjunction and non-superjunction VDMOS devices are constructed with trench gate electrodes. As known in the art, the gate electrode of a trench gate device is disposed within a trench etched into the surface of the device, in a manner that is insulated from the surrounding semiconductor by a gate dielectric. The channel region of the trench gate VDMOS device is oriented vertically, which vertically orients the source-drain current through that channel region.

FIG. 2a illustrates, in cross-section, the physical structure of the bias connection to the source and body regions of conventional VDMOS device 2' of FIG. 1b for the planar gate electrode case. Non-superjunction devices, such as VDMOS device 2 of FIG. 1a, typically have a similar bias connection structure. In the example of FIG. 2, the bias connection to n+ source regions 10 and body region 8 is made by source metal 14, which is realized as a single metal level metal conductor overlying insulator layer 13 above gate electrodes 12. As known in the art, a sidewall insulator may be present along the edges of gate electrodes 12. Contact openings are etched through insulator layer 13, at which source metal 14 contacts source regions 10 and body regions 8.

As conventional in the art for vertical power integrated circuits, multiple transistor structures of VDMOS device 2' are connected in parallel, with substrate 4 serving as the drain for all of the transistor structures, and with source metal 14 connecting body regions 8 and source regions 10 for all of the structures in parallel. In a top-down (i.e., plan) view, source metal 14 may thus appear as a single continuous sheet over the active area of VDMOS device 2'. The large source/drain current conducted by VDMOS device 2' requires the thickness $T_{met}$ of source metal 14 to be significantly thicker than metal conductors in low-voltage analog and logic integrated circuits. For example, a source metal thickness on the order of several microns (e.g., 2 to 10 μm) is common in modern vertical power devices.

In the conventional source-gate architecture of FIG. 2a, source regions 10 are implanted in a self-aligned fashion relative to gate electrode 12 as mentioned above. Accordingly, in order to make contact between source metal 14 and p-type body regions 8 in this conventional construction, the contact openings through insulator 13 are overetched into the underlying epitaxial silicon, with that etch extending to a depth $D_{ct}$ fully through source regions 10 and into the underlying body regions 8, as shown in FIG. 2a. Because of this etch into the single-crystal silicon, the deposited source metal 14 will be physically in contact with source regions 10 and also with body region 8.

This conventional source-gate architecture presents limitations to the performance and scalability of the vertical power device. One such limitation is the parasitic gate-to-source capacitance presented between gate electrodes 12 and source metal 14. As known in the art, gate-to-source capacitance in an MOS transistor can limit the switching speed of the device, and as such should be minimized to the extent practicable. Referring to the detail view of VDMOS 2' shown in FIG. 2b, parasitic gate-to-source capacitance Cgs is presented at both the top surface and side edges of gate electrode 12.

The gate-to-source capacitance Cgs of VDMOS 2' varies inversely with the thickness $T_{insul}$ of insulator layer 13 between the top surface of gate electrode 12 and overlying source metal 14. To maximizing switching performance, therefore, it is desirable to increase this thickness $T_{insul}$ as much as possible. However, referring back to the view of FIG. 2a, increases in the thickness $T_{insul}$ of insulator layer 13 adversely affects the ability of the deposited source metal 14 to make reliable contact to source regions 10 and body regions 8 for a given contact width $W_{ct}$. This difficulty is exacerbated by the increased source metal thickness $T_{met}$ required by the large source-drain currents of VDMOS 2'. More specifically, as known in the art, the deposition of source metal 14 into a contact opening of a width (i.e., contact width $W_{ct}$) that is less than twice the thickness $T_{met}$ of the deposited film for a given thickness $T_{insul}$ of insulator layer 13 can cause self-shadowing or even "bread-loafing" of the deposited metal, in which the deposited thickness of source metal 14 is thinned as it descends into the contact opening. Step coverage of source metal 14 within the contact is thus reduced, rendering VDMOS device 2' vulnerable to electromigration of source metal 14 during its operating life, thereby increasing device failures and reducing the device reliability. As a result, the extent to which gate-to-source capacitance can be reduced by increasing the insulator thickness $T_{insul}$, for a given contact width $W_{ct}$, is limited in these conventional gate-source architectures.

Conversely, this interaction between metal thickness $T_{met}$ and insulator thickness $T_{insul}$ also limits the ability to scale power devices to smaller geometries. The pitch of source and gate structures at the surface of the integrated circuit depends not only on gate width but also on the contact width $W_{ct}$. But because shrinking of the contact width $W_{ct}$ necessitates reducing either or both of the insulator thickness $T_{insul}$ and the source metal thickness $T_{met}$, scaling of the vertical power device structure necessarily comes at a cost of increased parasitic gate-to-source capacitance Cgs or decreased current capability.

BRIEF SUMMARY OF THE INVENTION

Disclosed embodiments provide a vertical power device structure and method of making the same in which the gate-to-source capacitance can be optimized without significantly impacting metal conductor reliability.

Disclosed embodiments provide such a structure and method that provides improved manufacturability.

Disclosed embodiments provide such a structure and method that can be scaled to smaller geometries without significant sacrifices in current capability and device performance.

Disclosed embodiments provide such a structure and method in which gate-to-source capacitance and device pitch can be independently optimized.

Other objects and advantages of the disclosed embodiments will be apparent to those of ordinary skill in the art having reference to the following specification together with its drawings.

According to certain embodiments, a vertical drift metal-oxide-semiconductor (VDMOS) transistor is constructed at a surface of a semiconductor device. Source regions, doped to a first conductivity type, are disposed within body regions of a second conductivity type at the surface of the semiconductor device. Gate electrodes overlie portions of respective body regions between the source regions and a drift region between adjacent body regions. A body contact region of the second conductivity type is disposed within each body region, between source regions. Metal silicide cladding is disposed at the surface of the body contact region and the adjacent source regions. A planarized insulating layer overlies the gate electrodes, with a metal contact plug formed in contact openings in that insulating layer to contact the metal silicide cladding. A metal conductor overlies the planarized insulating layer, and contacts the metal contact plugs.

According to certain embodiments, a method of fabricating a VDMOS transistor includes forming gate electrodes spaced apart from one another near a surface of a semiconductor of a first conductivity type, and forming doped body regions of a second conductivity type at the surface, spaced apart from one another by locations of the surface underlying the gate electrodes. Dopant of the first conductivity type is then implanted to define source regions of the first conductivity type into the body regions, with the implant masked to define gaps in the source regions. Dopant of the second conductivity type is then implanted to form body contact regions at the gap locations. Metal silicide cladding of the surface of the source regions and the body contact regions is then performed. An insulator layer is disposed overall, and planarized. Contact openings to the clad source regions and body contact regions are formed through the insulator layer, and conductor plugs are formed in the contact openings. Metal conductors are then formed to contact the conductor plugs.

BRIEF DESCRIPTION OF THE SEVERAL
VIEWS OF THE DRAWING

FIGS. 5a through 5h are cross-sectional diagrams of a portion of the superjunction VDMOS transistor of FIGS. 3a and 3b at various stages of manufacture according to the embodiment of FIG. 4.

DETAILED DESCRIPTION OF THE
INVENTION

The one or more embodiments described in this specification are implemented into a vertical drift metal-oxide-semiconductor (VDMOS) transistor structure of the superjunction type, as it is contemplated that such implementation is particularly advantageous in that context. However, it is also contemplated that concepts of this invention may be beneficially applied to other applications, for example other vertical power devices such as non-superjunction VDMOS devices, vertical insulated gate bipolar transistors (IGBTs), and vertical gated power diodes. Accordingly, it is to be understood that the following description is provided by way of example only, and is not intended to limit the true scope of this invention as claimed.

Figure 3A:
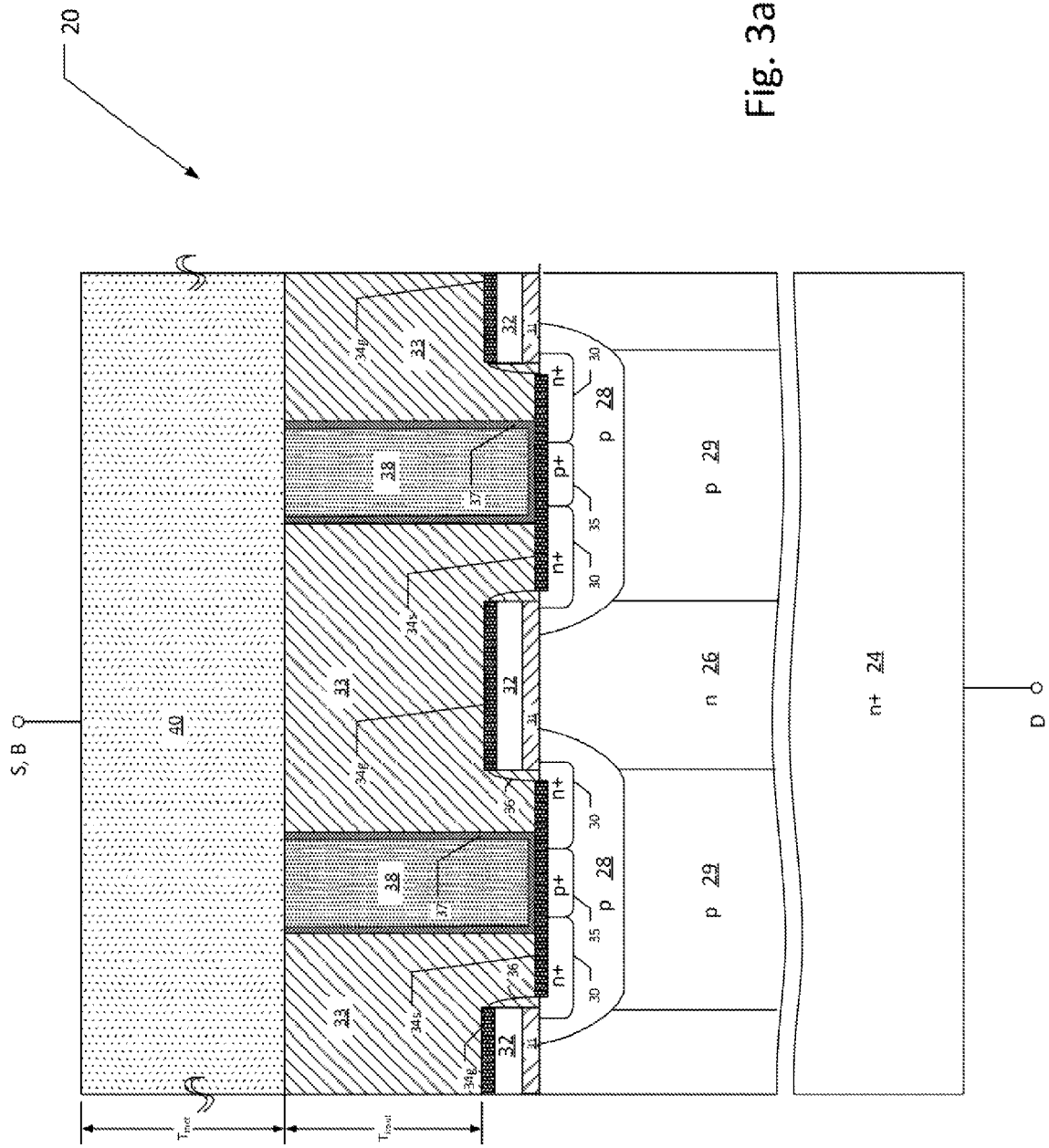
FIG. 3a is a cross-sectional view of a portion of a superjunction VDMOS transistor constructed according to an embodiment.
Figure 3B:
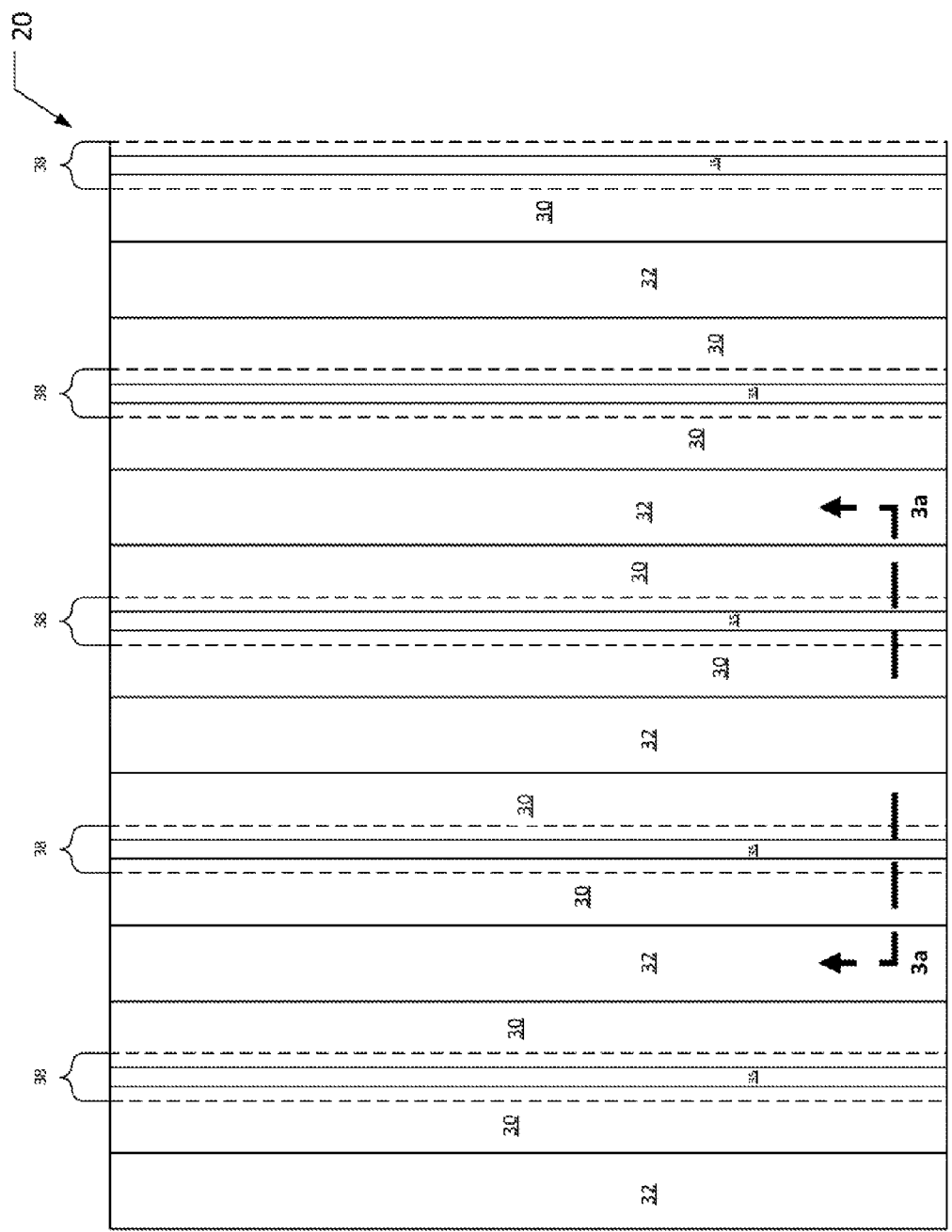
FIG. 3b is a plan view of a portion of the VDMOS transistor of FIG. 3a according to that embodiment.

FIGS. 3a and 3b illustrate, in cross-sectional and plan view, respectively, the arrangement of various features in the construction of superjunction VDMOS 20 according to a preferred embodiment of the invention. This embodiment will be described for the example of an n-channel VDMOS transistor, and as such will be described as formed in an n-type silicon substrate with n-type epitaxial silicon grown over that substrate; it is of course contemplated that those skilled in the art having reference to this specification will be readily able to adapt these embodiments to alternative types of power devices such as trench gate VDMOS transistors, non-superjunction VDMOS devices, p-channel VDMOS transistors, IGBTs, and gated vertical power diodes, without undue experimentation.

FIG. 3a illustrates a portion of VDMOS 20 as partially fabricated in an integrated circuit. As noted above, VDMOS 20 is fabricated at relatively heavily-doped n+ substrate 24 that serves as the drain node of the transistor, upon which a drift region of more lightly-doped n-type epitaxial layer 26 is formed. N-type epitaxial layer 26 extends to the surface of the single-crystal silicon. In this superjunction construction, p-type doped "pillars" 29 are formed into epitaxial layer 26, and are spaced apart from one another as shown in FIG. 3a, with regions of the n-type semiconductor provided by epitaxial layer 26 interleaved with pillars 29. As known in the art, these p-type pillars 29 may be constructed by ion implantation during the formation of epitaxial layer 26, for example in a multiple step epitaxial process in which a p-type pillar implant is performed after epitaxy of a portion of layer 26, such that each pillar 29 is formed as a number of vertically aligned segments.

In this embodiment, as typical for planar gate VDMOS devices, p-type body regions 28 are disposed atop pillars 29, at the surface of epitaxial layer 26. P-type body regions 28 serve as the body region of n-channel VDMOS transistor 20. N+ source regions 30 are disposed within corresponding body regions 28, and will receive the source bias through conductors as will be described herein. Gate dielectric 31 and gate electrodes 32 overlie respective portions of p-type body regions 28 between source regions 30 and surface portions of n-type epitaxial layer 26. In this example, sidewall insulator filaments 36, for example of a silicon oxide or a silicon nitride, are disposed along the sidewalls of gate electrodes 32.

According to this embodiment, p+ body contact regions 35 are disposed within body regions 28, in each instance at a location between source regions 30 present in that same body region 28. As evident from FIG. 3a, the source regions 30 on either side of a body contact region 35 within a body region 28 operate in connection with different gate electrodes 32 on either side of that body region 28. P+ body contact regions 35 are sufficiently heavily doped to provide good ohmic contact to body regions 28. In this embodiment, the surface of source regions 30 and body contact regions 35 are clad with metal silicide 34s, such as a titanium silicide or a cobalt silicide, and as such are electrically connected together so that source regions 30 and body region 28 are at the same potential. As will be described below in connection with the fabrication of VDMOS 20, gate electrodes 32 may be clad with metal silicide 34g, which may be formed simultaneously with metal silicide 34s. Sidewall insulator filaments 36 assist in maintaining separation of gate cladding 34g from source cladding 34s, and also assist in controlling the threshold voltage of the device as will be discussed below.

In this embodiment, as shown in FIG. 3a, insulator layer 33 is disposed over the active structure of VDMOS 20, including gate electrodes 32 and source regions 30. This insulator layer 33, which may be a silicon oxide, silicon nitride, an organic dielectric, or other dielectric material, or combinations thereof, has an upper surface which is substantially planar, and which therefore does not follow the topography of the underlying structure. Contact to source regions 30 and body regions 28 is made through contact openings in insulator layer 33, into which conductive plugs 38 of tungsten or another suitable metal or metal compound are disposed. In this example in which tungsten is the material of conductive plugs 38, barrier layer 37 is disposed along the sidewalls of these contact openings in insulator 33 and at the bottom of the opening at silicide film 34s. As known in the art, barrier layer 37 may be composed of one or more metals or conductive metal compounds, of the appropriate thickness and composition to prevent migration of the material of conductive plugs 38 into the underlying silicon.

Also in this embodiment, source metal 40 is disposed at the surface of insulator layer 33, and in contact with the tops of conductive plugs 28. Source metal 40 is of conventional construction for metal conductors in power devices such as VDMOS 20, typically including aluminum, copper, or a combination of metals appropriate for supporting the current expected to be conducted by the device.

FIG. 3b illustrates, in plan view, a portion of the integrated circuit of FIG. 3a in which VDMOS 20 is fabricated, at a point in time prior to the cladding of source regions 30, body contact regions 35, and gate electrodes 32, and thus prior to the deposition of insulator layer 33 and source metal 40. As evident from FIG. 3b, the various structures shown in cross-section in FIG. 3a are arranged as parallel "stripes" extending across the interior of the integrated circuit die at which VDMOS 20 is being formed. The structures evident in the view of FIG. 3b include gate electrodes 32, source regions 30, and body contact regions 35 (although present at this point, sidewall insulator filaments 36 are not shown in FIG. 3b for clarity). FIG. 3b also illustrates in shadow the location and shape of conductive plugs 38, which are disposed in contact openings through overlying insulator layer 33 as shown in FIG. 3a. When fabrication is completed for this example implementation, it is contemplated that source metal 40 will overlie the entire portion of the structure shown in FIG. 3b as a single conductor, i.e. in the shape of single sheet of metal, with that single conductor making contact to the tops of all conductive plugs 38. Source regions 30 (and body regions 28) will thus be connected in parallel, just as substrate 24 (FIG. 3a) provides a single drain node for VDMOS 20. In this embodiment, because the upper surfaces of insulator layer 33 and conductive plugs 38 are substantially planar, source metal 40 as deposited over those structures will also have a substantially flat upper surface, upon which a passivation dielectric layer (not shown) can then be subsequently deposited.

The structures shown in FIGS. 3a and 3b, as well as body regions 38 and pillars 29 (not visible in FIG. 3b), are arranged within a central "core" region of the die, which is a functionally active region of the surface of VDMOS 20. It is contemplated that the structures shown in FIG. 3a will extend fully across this core region, with many more (e.g., as many as on the order of hundreds) of similar structures provided in parallel with those few shown in FIG. 3b. As known in the art, and as described for example in copending and commonly assigned U.S. application Ser. No. 14/873, 831, filed Oct. 2, 2015 and incorporated herein by reference, VDMOS transistor 20 in this embodiment will typically also include a termination region surrounding this "core" region. As described in the above-incorporated U.S. application Ser. No. 14/873,831, that termination region includes termination structures such as field plates, guard rings, non-active pillars, and the like to laterally sustain the off-state drain-to-source voltage, essentially by smoothly twisting the electric field from vertical (at the core) to horizontal (at the outer edge of the die) while preventing the peak electric field from reaching the critical electric field and causing device breakdown.

Alternatively to the structures of FIGS. 3a and 3b being in the form of parallel stripes, p-type pillars 29 and the other corresponding elements of VDMOS 20 may be arranged as an array of "cells". U.S. Pat. No. 9,117,899, issued Aug. 25, 2015, commonly assigned herewith and incorporated herein by reference, describes an example of such a cell type geometry for the case of a trench gate VDMOS transistor. It is contemplated that those skilled in the art having reference to this specification can readily adapt the example shown in FIGS. 3a and 3b and described above to such a "cell" type structure, without undue experimentation.

The structure of a vertical power device according to this embodiment provides important advantages in performance, scaling, manufacturability, and reliability. In particular, this structure separates the parameter of the thickness $T_{insul}$ of insulator layer 33 from the parameter of the thickness $T_{met}$ of source metal 40, such that each of these thicknesses can be selected without being significantly limited by the other. More specifically, in this embodiment the thickness $T_{insul}$ of insulator layer 33 over gate electrode 32 can be selected to minimize gate-to-source capacitance Cgs, without being limited by the ability of source metal 40 to make a reliable contact to source regions 30 and body regions 28. Conversely, in this embodiment the thickness $T_{met}$ of source metal 40 can be selected to support the high currents conducted by VDMOS 20 when in the on-state, without being limited by step coverage into the source/body contact openings, or by the width of those contact openings or the thickness $T_{insul}$ of insulator layer 33, avoiding a tradeoff between the thickness $T_{met}$ of source metal 40 and the thickness $T_{insul}$ of insulator layer 33. In addition, the switching performance and current capacity of VDMOS 20 can be significantly improved over conventional structures. The silicide cladding of source regions 30, body contact regions 35, and gate electrodes 32 also improves device performance, by reducing the resistance of those structures and contacts.

Figure 1A:
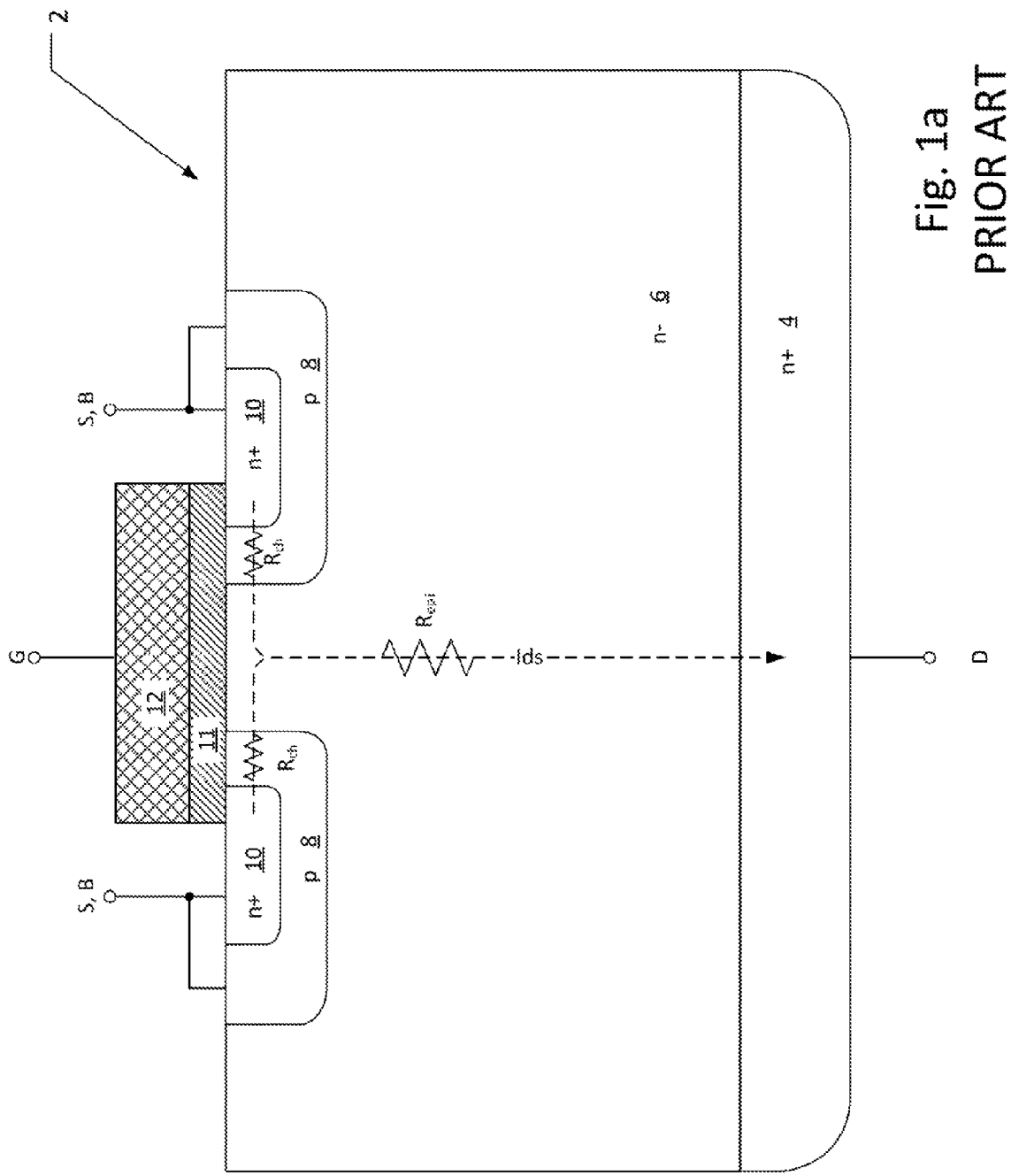
FIGS. 1a and 1b are cross-sectional views of conventional non-superjunction and superjunction VDMOS transistors, respectively.
Figure 1B:
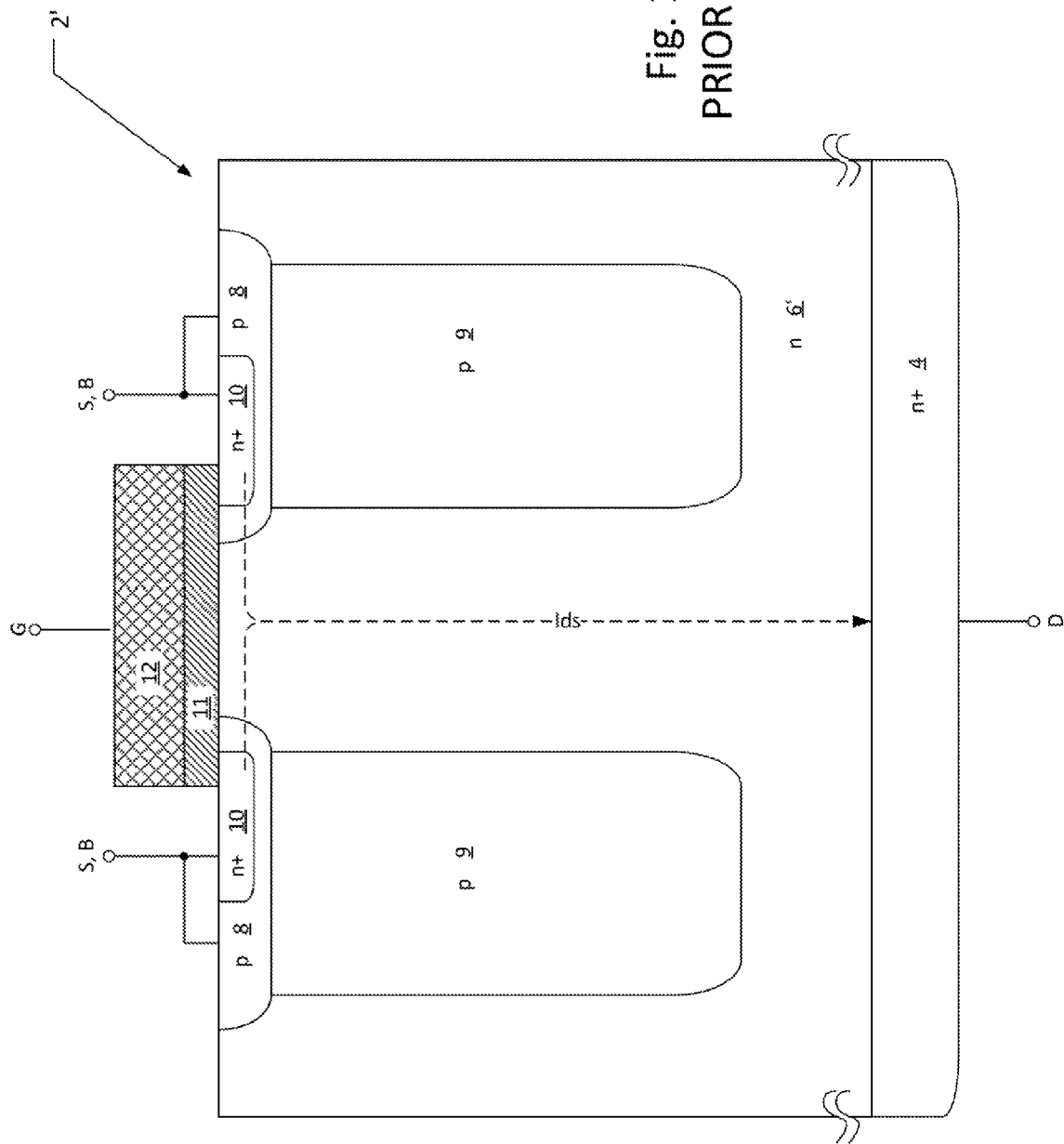
Figure 2A:
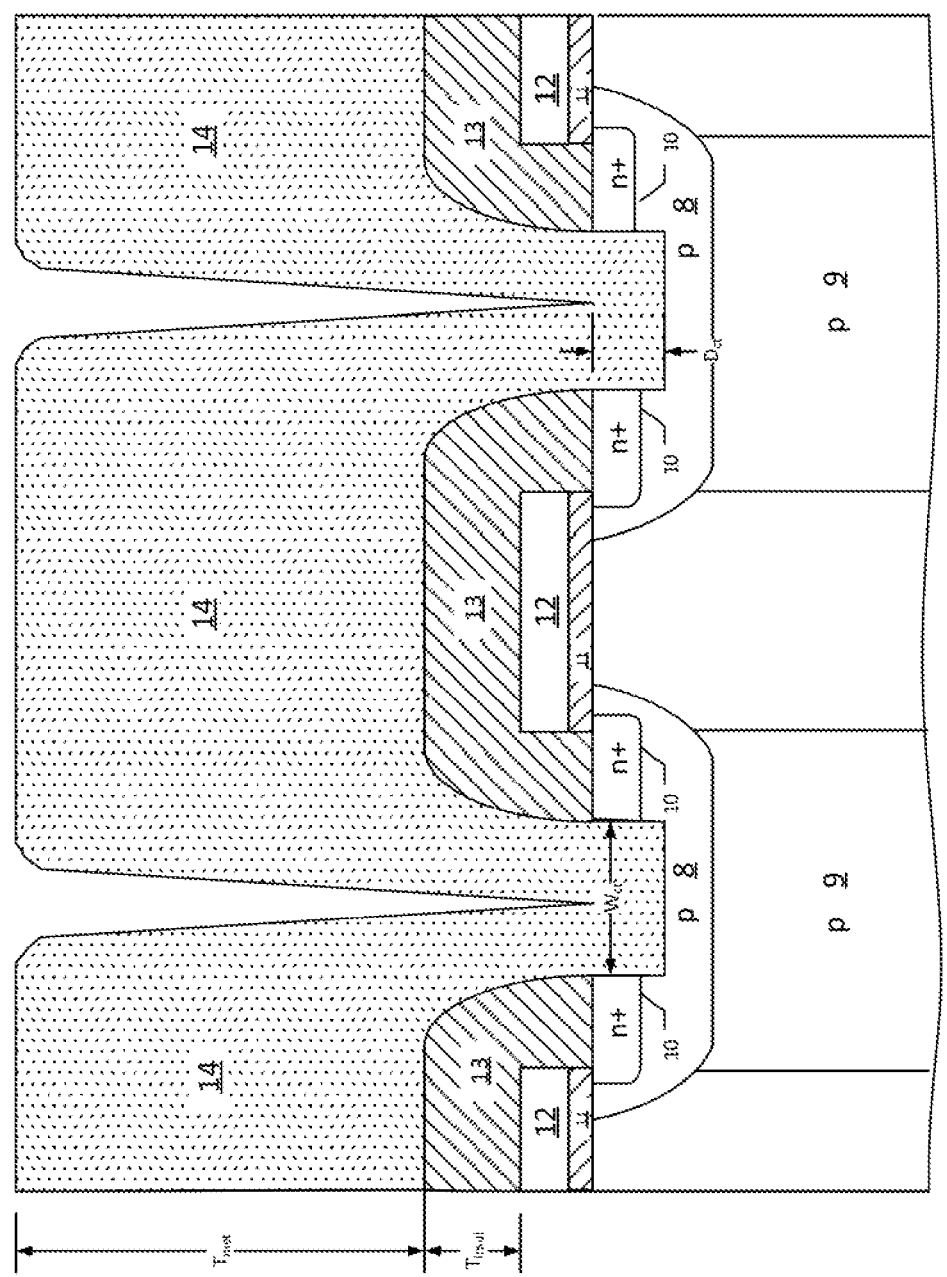
FIGS. 2a and 2b are cross-sectional views of the source and body region contact in a conventional superjunction VDMOS transistor.
Figure 2B:
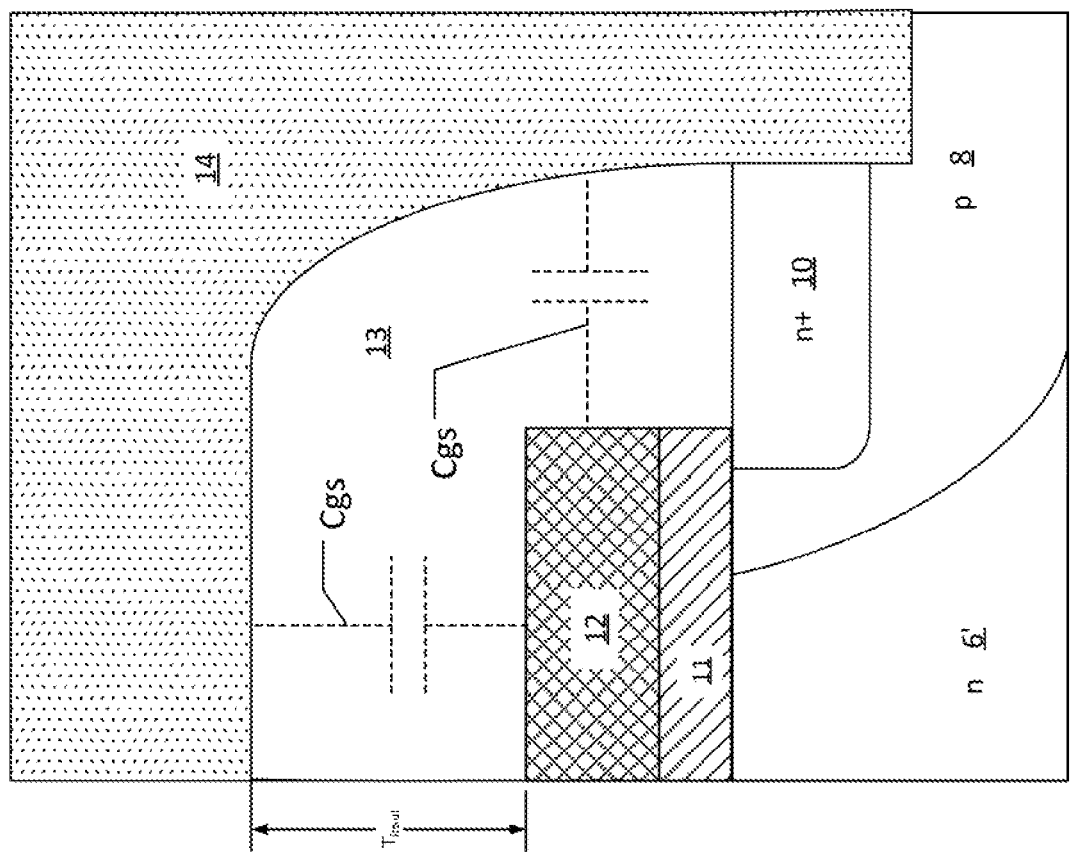

For similar reasons, this embodiment of the invention provides a more manufacturable and reliable structure, in that thinning of the source metal at its contacts to silicon is greatly eliminated. In addition, this embodiment provides a significantly more manufacturable structure by eliminating the need to etch through the source regions in order to make contact to the body regions, as is necessary in conventional structures such as described above relative to FIGS. 2a and 2b.

This embodiment also enables further scaling of the device size of VDMOS 20. In this construction, the width of the contact openings through insulator 33 is not limited by the thickness $T_{met}$ of source metal 40, as in conventional structures in which the shadowing of metal deposition occurs as a result of the contact opening being too narrow for the desired source metal thickness. According to this embodiment, the contact pitch is not affected by the thickness $T_{met}$ of source metal 40, and as such the two parameters can be independently selected. Furthermore, the potential reliability of VDMOS 20 is enhanced by the elimination of step coverage issues of source metal 40. And since the top surface of source metal 40 is substantially planar as shown in FIG. 3a, the integrity of the overlying passivation layer is also enhanced due to the absence of topographical steps at that surface.

It is contemplated that these and other advantages of the structure of a VDMOS transistor according to this embodiment will be apparent to those skilled in the art having reference to this specification.

Figure 4:
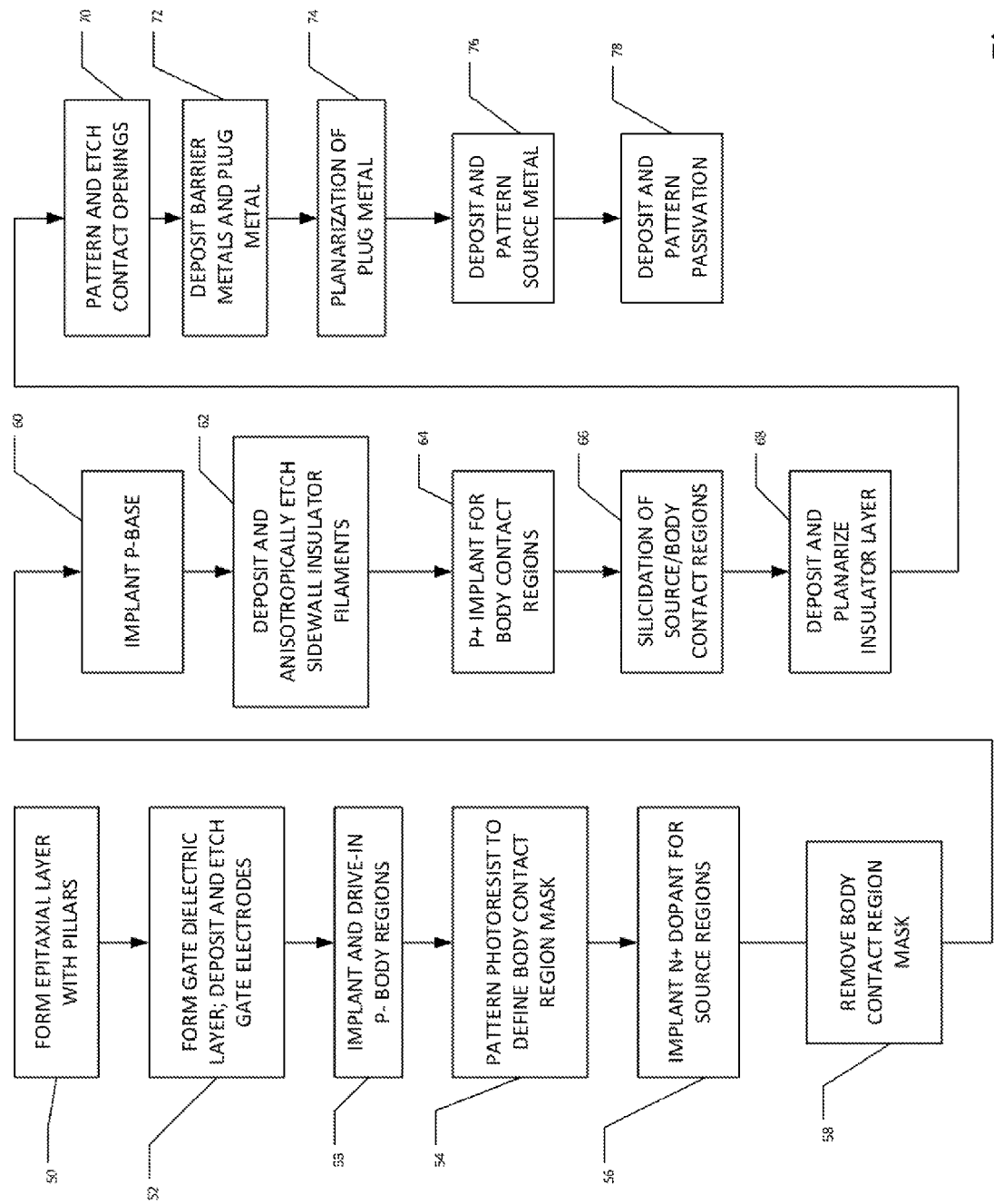
FIG. 4 is a flow diagram illustrating a method of fabricating the superjunction VDMOS transistor of FIGS. 3a and 3b according to an embodiment.

Referring now to FIG. 4 in combination with FIGS. 5a through 5h, a method of fabricating VDMOS 20 according to an embodiment of the invention will now be described. This method begins, in process 50, with the epitaxial formation of n-type drift epitaxial layer 26 onto n+ substrate 24, according to conventional epitaxy as known in the art. For this embodiment in which VDMOS 20 is a superjunction device, process 50 will form epitaxial layer 26 in several iterations, each including the epitaxial formation of a selected thickness of n-type silicon, followed by a masked implant of p-type dopant (e.g., boron) at the locations at which pillars 29 are to be formed and (optionally) anneal of the implanted dopant. The pillar implants are aligned with one another so as to form multiple pillars of p-type dopant extending to the desired depth from the surface of epitaxial layer 26; these pillars 29 are separated from one another by regions of the n-type epitaxial silicon of layer 26, as described above.

The gate structures of VDMOS 20 are then formed in process 52 according to this embodiment. In the conventional manner, gate dielectric 31 may be formed by thermal oxidation of the surface of epitaxial layer 26 (and body regions 28); alternatively, gate dielectric 31 may be a deposited layer of silicon dioxide, silicon nitride, another suitable gate dielectric material, or a combination of these materials. Gate electrodes 32 are then formed in the conventional manner by deposition of a layer of the desired gate material, such as polycrystalline silicon, followed by photolithographic patterning and etch to define gate electrodes 32 at the desired locations and of the desired dimensions.

In process 53, body regions 28 are formed at the surface of epitaxial layer 26 by ion implantation followed by a drive-in anneal. The dopant (e.g., boron) as implanted in process 53 is self-aligned with the edges of gate electrodes 32, and will laterally diffuse under gate electrodes 32 as a result of the drive-in anneal. The eventual channel length of VDMOS 20 will depend on the distance that the p-type body region dopant implanted in process 53 laterally diffuses beyond that to which the subsequent n-type source implant diffuses. The implant of process 53 is also aligned with pillars 29 so that body regions 28 form contiguous p-type regions with corresponding pillars 29. The dopant concentration of body regions 28 may differ from that of pillars 29, and will typically be optimized for the desired transistor characteristics. In addition, the lateral boundaries of body regions 28 may differ from that of the corresponding underlying pillars 29, as suggested by FIG. 3a described above.

Figure 5A:
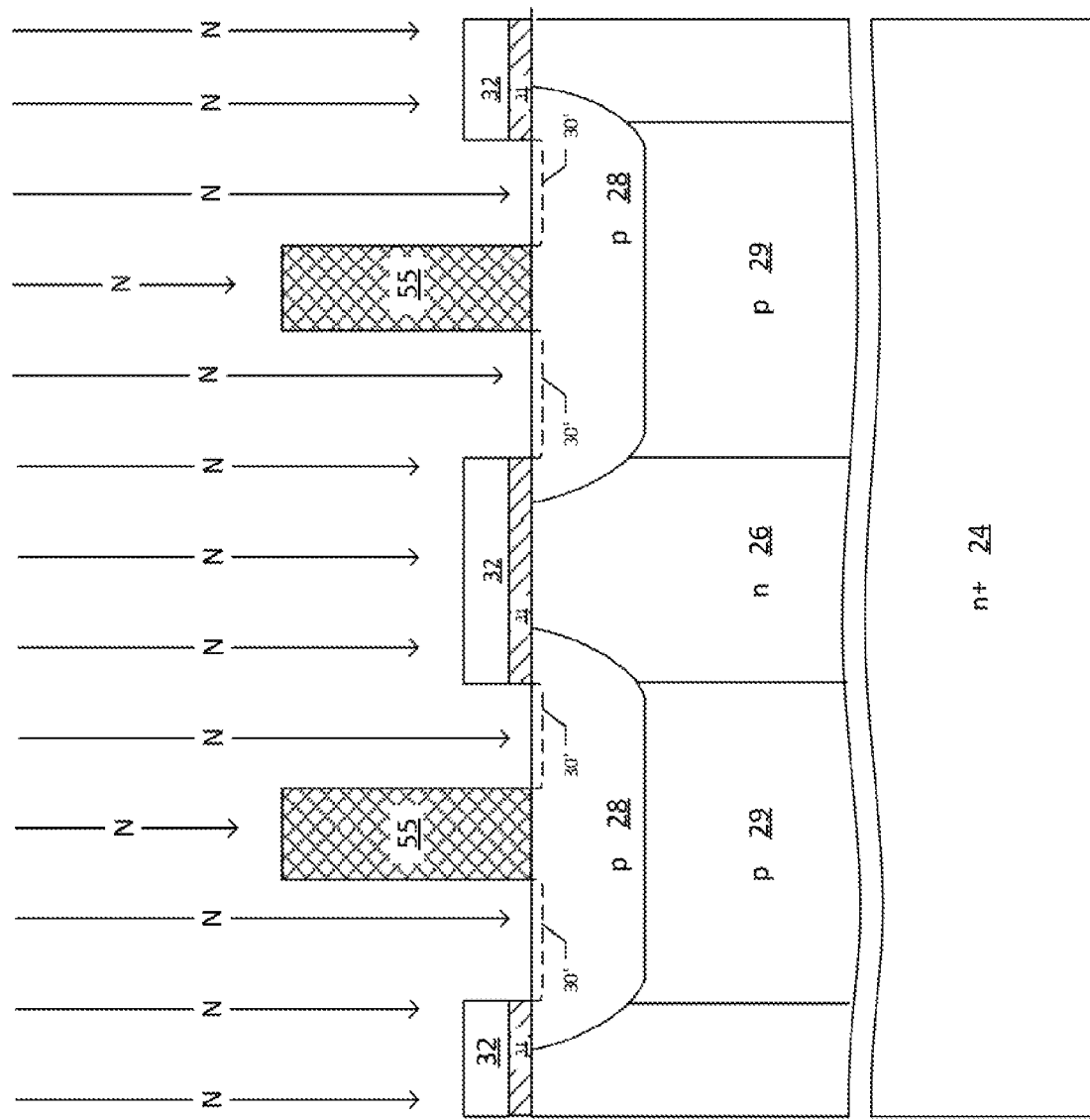

After the formation of gate electrodes 32 and body regions 28 in processes 52, 53, the locations of p+ body contact regions 35 at the surface of body regions between gate electrodes 32 are photolithographically defined in process 54. Process 54 may be performed in the conventional manner, for example including the dispensing of photoresist, photolithographic exposure of the photoresist to define the desired pattern, and developing of the exposed photoresist to selectively remove the portions not to serve as the eventual mask. FIG. 5a illustrates the structure of VDMOS 20 at a point in the fabrication following process 54, specifically with photoresist mask features 55 remaining at locations within the space between gate electrodes 32. Exposed locations 30' of the surface of body regions 28 on either side of those mask features 55 receive ion implantation of n-type dopant (e.g., arsenic, phosphorous) in process 56, as shown in FIG. 5a; the implanted dopant will be diffused to the desired profile by a subsequent drive-in anneal. The dose and energy of the source implant of process 56 may be selected in the conventional manner well-known in the art to result in the desired dopant profile following that anneal and other subsequent thermal processes; for example, this source implant may be a phosphorous or arsenic implant at a dose generally in the range of 5E15-1E16 atoms/cm$^2$ and an energy generally in the range of 30-200 KeV. In this embodiment, the anneal of this source implant is performed as a single thermal process following additional implants as will be described below; alternatively, an anneal may be performed at this point, immediately after source implant process 56.

Following source implant process 56, photoresist mask features 55 are removed in process 58. As typical in the art for vertical power devices, a p-type implant may then be performed in process 60, at a dose and energy sufficient to provide an eventual heavily doped p-type region within body regions 28 and underlying source regions 30. This "p-base" region reduces the tendency of the parasitic SCR in VDMOS 20 to trigger and cause latchup of the structure, as known in the art. In this example, anneal of this p-base implant is performed in a single anneal following a subsequent implant; alternatively, an anneal may be performed after this implant process 60, to drive in the p-base implant and, perhaps, also the source implant.

Process 62 is then performed to form sidewall insulator filaments 36 along the side edges of gate electrodes 32. Process 62 may be performed in the conventional manner, for example by deposition of the desired dielectric material (e.g., silicon oxide, silicon nitride), followed by an anisotropic etch to clear the surfaces of gate electrodes 32 and body regions 28 while leaving filaments 36 in place.

Figure 5B:
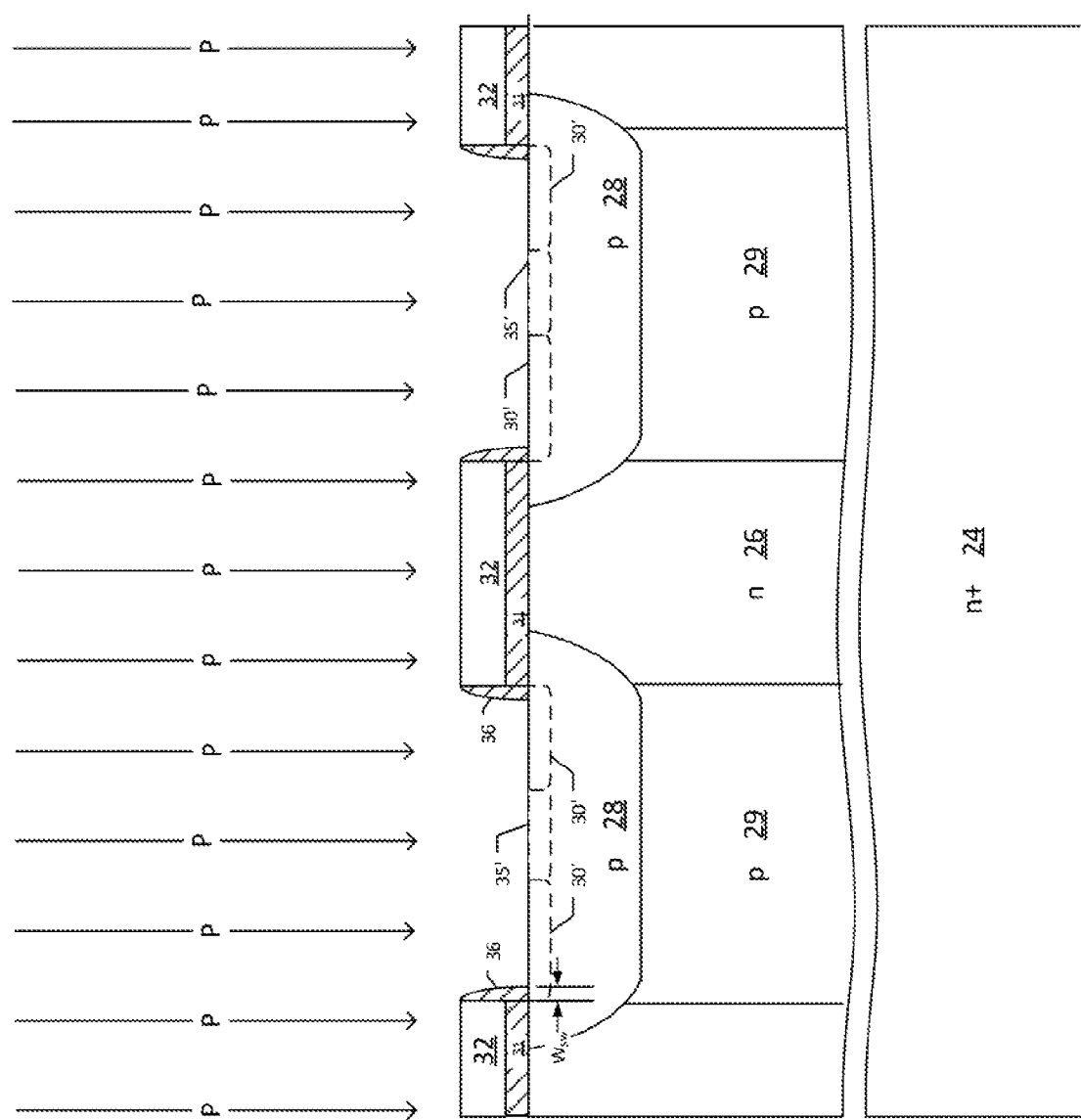

Ion implantation of p-type dopant (e.g., boron) to form p+ body contact regions 35 is then performed in process 64, as shown in FIG. 5b. Because mask features 55 were removed in process 60, the implant of process 64 will heavily dope the gaps between source regions 30 in each body region 28. This implant will be of a dose and energy selected sufficient for body contact region 35 to provide good ohmic contact, for example, a boron or BF$_2$ implant of a dose generally in the range of 1E15-5E15 atoms/cm$^2$ at an energy generally in the range of 20-200 Key. However, the dose of this p+ body contact region implant should be less than that of the n+ source implant, to allow the n+ source implant to dominate in n+ source regions 30. Following this ion implantation, a high temperature anneal is performed to anneal the dopant implanted in process 64, and perhaps also the dopant implanted in processes 56 and 60, to result in the desired dopant profile of source regions 30 and body contact regions 35 (and the heavily doped portions of body regions 28 formed by p-base implant 60).

The formation of sidewall insulator filaments 36 along gate electrodes 32 in process 62, after the body region implant of process 53 and before the body contact implant of process 64 according to this embodiment, enables enhanced control of the threshold voltage of eventual VDMOS 20. More specifically, the width $W_{sw}$ of sidewall insulator filaments 36 spaces the p+ body contact region dopant implanted within n-type implanted locations 30' in this process 62 from the edges of laterally diffused edges of p-type body regions 28 underlying gate electrodes 32. This spacing facilitates control of the dopant concentration in the channel region underlying gate electrode 32, specifically within the portion of body region 28 between source region 35 and n-type epitaxial layer 26.

Figure 5C:
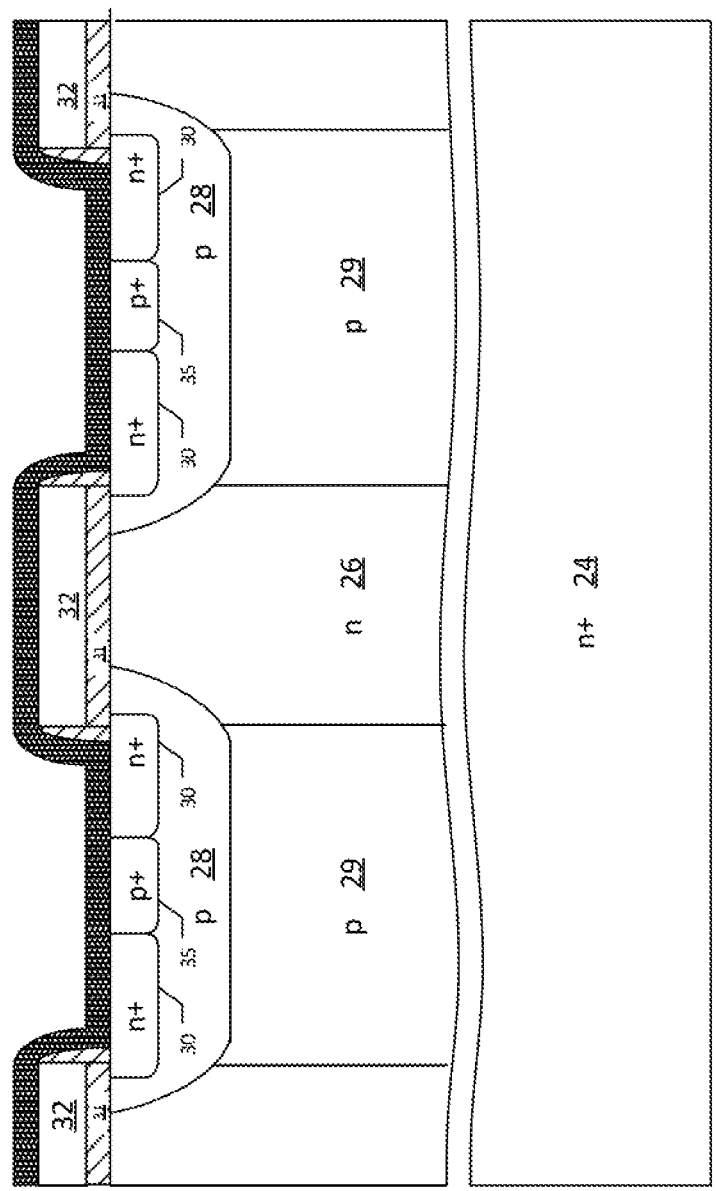
Figure 5D:
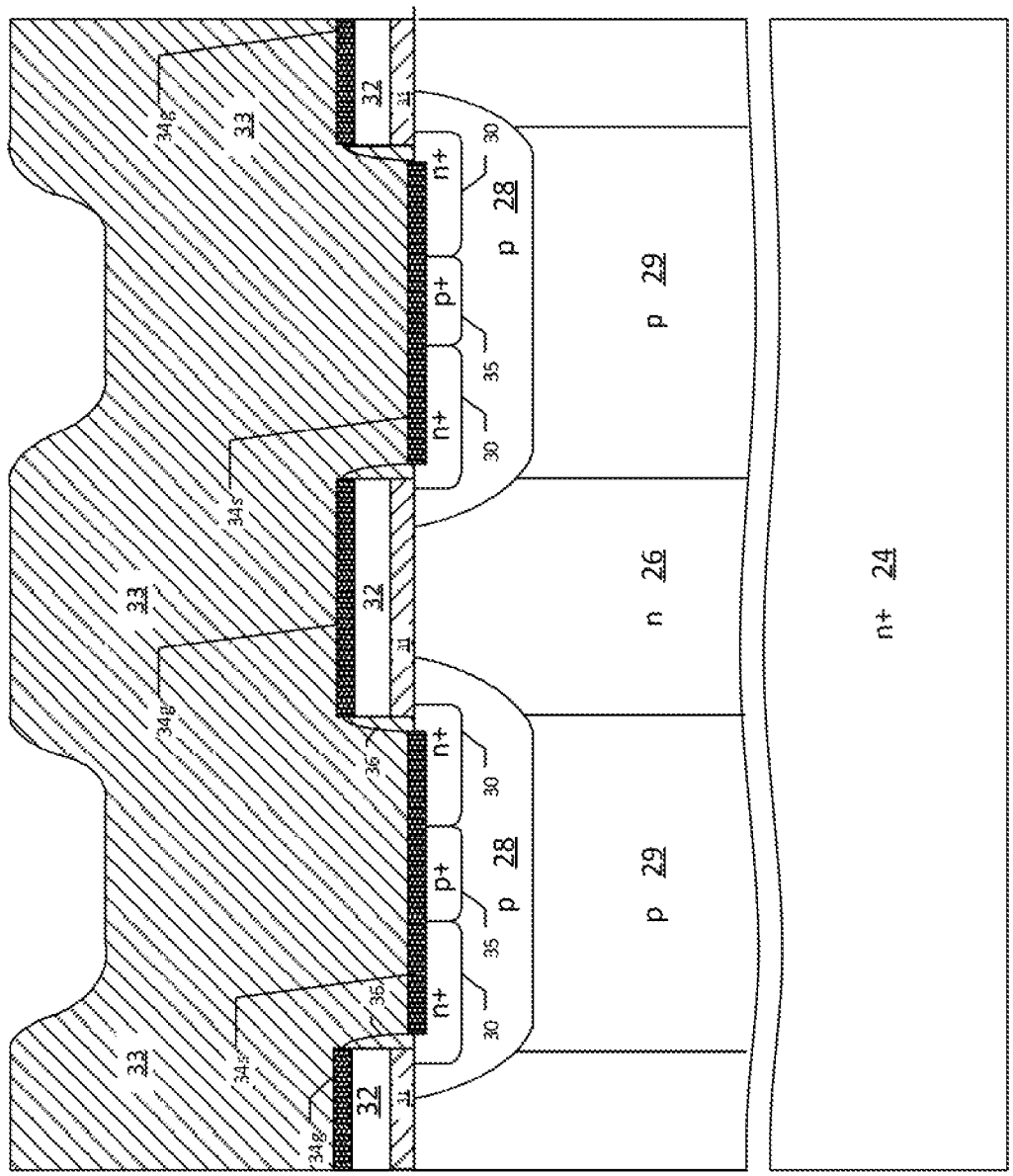

According to this embodiment, silicidation of the exposed surfaces of source regions 30, body contact regions 35, and perhaps gate electrodes 32 is performed in process 66. The well-known self-aligned direct react silicidation ("salicidation") technique may be used to clad these structures. As such, silicidation process 66 includes the deposition of a metal overall, in contact with both semiconductor material and also insulator material. Examples of metals suitable for silicidation include titanium, cobalt, and the like, as shown in FIG. 5c. Following metal deposition, silicidation process 66 continues with a high temperature anneal of the device in a suitable atmosphere (e.g., nitrogen), during which the portions of the deposited metal in contact with silicon will react to form a metal silicide, and portions of the deposited metal in contact with insulator material (silicon dioxide or silicon nitride, such as sidewall insulator filaments 36) will either not react or will form a different metal compound (e.g., titanium nitride). Silicidation process 66 is then completed by a blanket etch to remove the metal compound from the insulator structures while leaving metal silicide features in place, such as shown in FIG. 5d by metal silicide 34s at source regions 30 and body contact regions 35, and metal silicide 34g at gate electrodes 32. Sidewall insulator filaments 36 help to separate metal silicide 34g at the surface of gate electrodes 32 from metal silicide 34s at source regions 30, to avoid shorting of these structures. As discussed above, metal silicide 34s provides an electrical contact between source regions 30 and body contact regions 35, such that source regions 30 and body regions 28 will be at the same potential in operation of VDMOS 20. FIG. 5d also illustrates the profiles of source regions 30 and body contact regions 35 as a result of the post-implant anneal described above (as well as the high temperature anneal of silicidation process 66 itself).

Following silicidation process 66, insulator layer 33 is then deposited overall in process 68. In this embodiment, insulator layer 33 is formed of silicon dioxide deposited in the conventional manner by chemical vapor deposition; alternatively, other materials may be deposited in process 68, as appropriate for the function of insulator layer 33. As deposited, insulator layer 33 is generally conformal to the underlying topology, particularly that presented by gate electrodes 32, as shown in FIG. 5d. According to this embodiment, the upper surface of insulator layer 33 is planarized in process 68, for example by way of chemical mechanical polishing (CMP) or by a plasma etch-back process, to its final thickness $T_{insul}$ as shown in FIG. 5e.

Figure 5F:
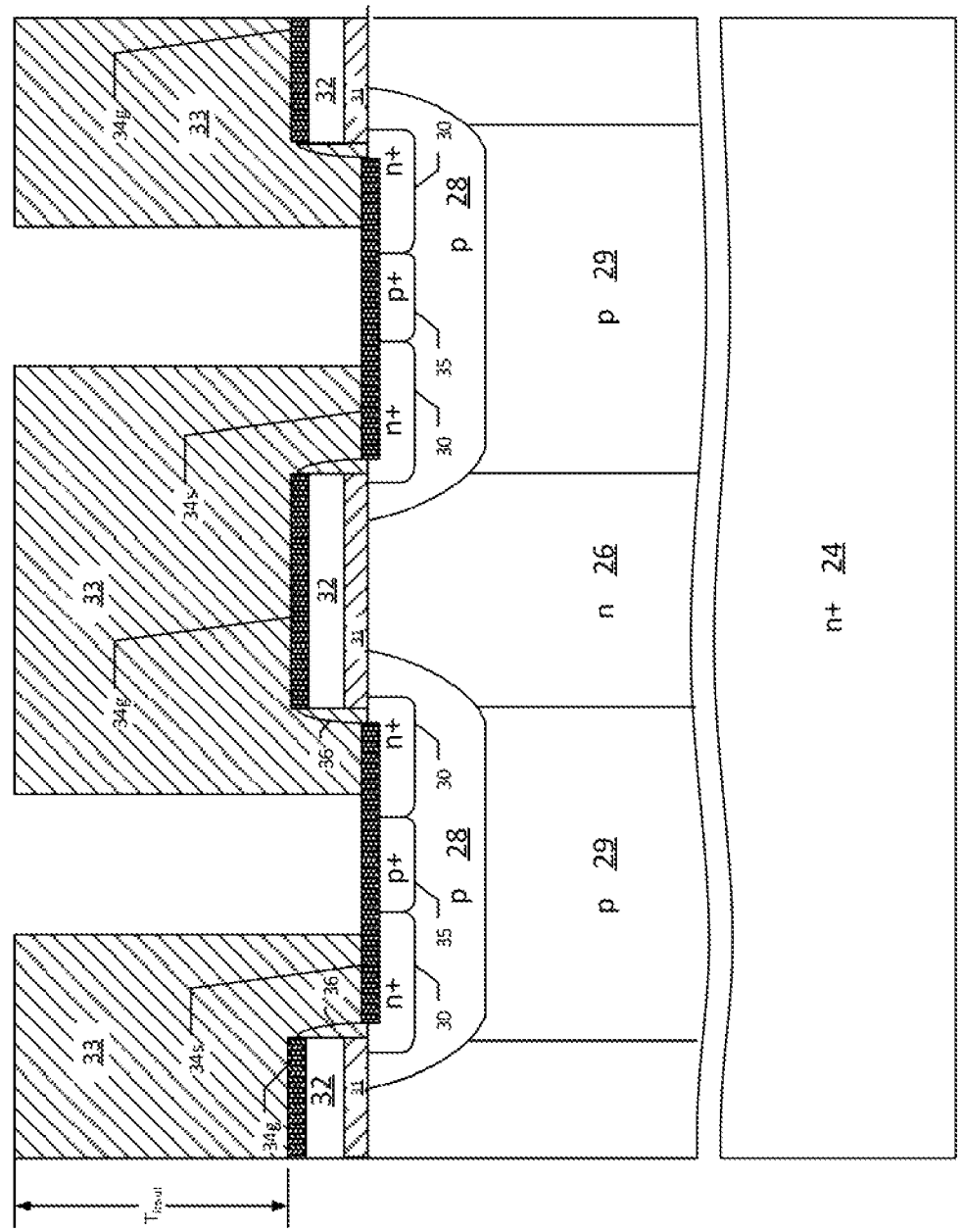

In process 70, contact openings are photolithographically patterned and etched through insulator layer 33 in the conventional manner to expose locations of silicide film 34s at source regions 30 and body contact regions 35. It may be preferable to perform the contact etch of process 70 by way of a conventional plasma etch in those implementations in which thickness $T_{insul}$ is significantly greater than the width of the contact openings. FIG. 5f illustrates the structure of VDMOS 20 following contact etch process 70.

Figure 5G:
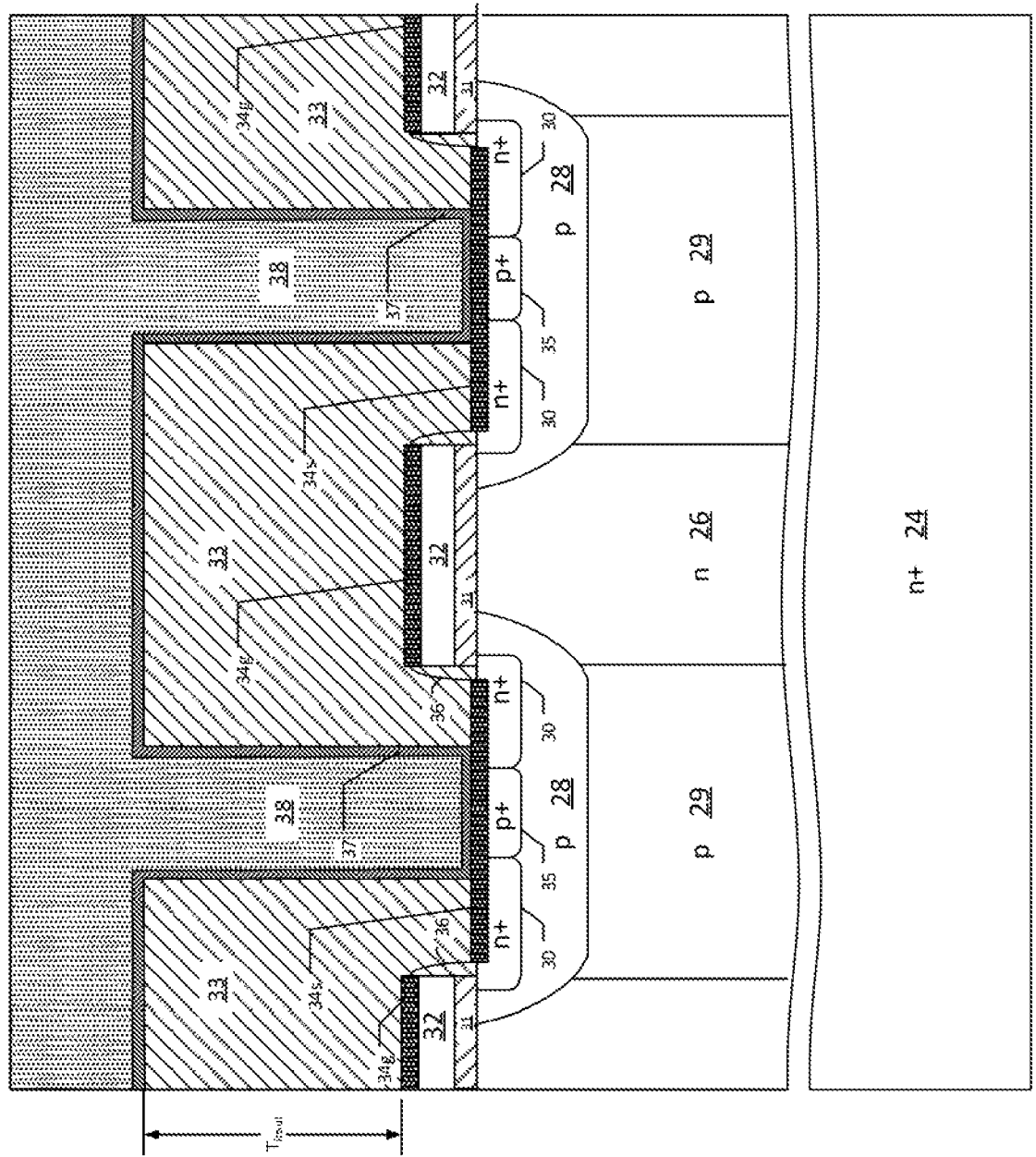

In process 72, the conductive material used to form conductive plugs 38 is deposited over the surface. Metals such as tungsten, titanium, and alloys of these and similar metals are commonly used as the metal of conductive plugs, and may serve as conductive plugs 38 in this embodiment. For metals such as tungsten, it is useful to first deposit one or more barrier layers 37 in process 72 to inhibit diffusion of metal atoms from conductive plugs 38 into the active semiconductor; examples of suitable barrier layers include metals such as titanium, and metal nitrides such as titanium nitride. As shown in FIG. 5g, barrier layers 37 are deposited overall, under conditions that cause the material to adhere to the sidewalls of the contact openings in insulator 33 as well as deposit onto exposed portions of silicide film 34s and the top surface of planarized insulator layer 33. Following the deposition of barrier layers 37, the metal of conductive plugs 38 is deposited overall, filling the remainder of the contact openings through insulator layer 33 and extending over barrier layers 37 at the top surface of insulator layer 33, as shown in FIG. 5g. It is contemplated that metal deposition process 72 can be carried out by conventional methods as known in the art for the selected metals. In process 74, plug metal 38 is removed in all regions except at the contact openings. Process 74 may be performed by chemical mechanical polishing (CMP) of plug metal 38 and barrier layers 37, stopping at the top surface of insulator layer 33 to result in the structure as shown in FIG. 5h. Alternatively, process 74 may remove only plug metal 38 either by CMP or by etching back, in either case stopping on the underlying barrier layers 37.

Following process 74, source metal 40 is then deposited, photolithographically patterned, and etched in process 76. In addition to serving as source metal 40 within the "core" region of VDMOS 20, as described above, this same metal layer can also serve as the conductor contacting gate electrodes 32 (i.e., as "gate metal") and also as the metal in equipotential rings in the termination region and periphery of the integrated circuit. Because the upper surface of insulator layer 33 is planarized in process 68, source metal 40 will exhibit minimal vertical topography variation at its top surface. For modern vertical power devices such as VDMOS 20, it is contemplated that the thickness $T_{met}$ of source metal 40 will be at least about 2 μm thick, and will typically be as thick as several μm (e.g., on the order of 4 to 5 μm, with an upper usage limit typically around 10 μm). A passivation layer is then deposited over the top surface of source metal 40 in process 80, with photolithographic patterning and etch performed to open bond pads and the like.

The planarization of source metal 40 in this implementation is contemplated to further improve the reliability of VDMOS 20, by providing a planar surface for the deposition of passivation material, such as silicon nitride having the desired properties, in process 80. As a result, the deposited passivation material is less subject to cracking at topological steps, and thus can have improved integrity.

The method of fabricating VDMOS 20 according to this embodiment provides particular advantages in connection with manufacturability. One such advantage in manufacturability is the elimination of the etch through the n+ source regions to make simultaneous contact to those source regions and the body regions, as described above relative to FIG. 2a. Such a timed etch into the underlying silicon is highly variable in practice, resulting in wide variations in the bias contact to the body regions and in the resulting electrical performance. In contrast, no etch into the underlying semiconductor is required according to this embodiment, but instead the source contact can reliably made using an end-pointed etch to a metal silicide film at the surface of source regions and a body contact region to the device body regions. Variation in the resulting contact among a population of VDMOS devices constructed in this manner is thus greatly reduced.

In addition, the advantages of performance, reliability, and scalability discussed above are provided by the fabrication method of this embodiment, without greatly complicating the manufacturing process. Only a single additional photolithography operation is required, specifically that defining the locations of the body contact regions in masking the source implant; this additional photolithography step is also somewhat non-critical insofar as alignment or size is concerned, as the precise placement of the body contact regions between the source regions is not particularly critical. As a result, excellent contact to source and body regions is provided in a manner that eliminates dependence among the insulator layer thickness, the source metal thickness, and the contact pitch. Gate-to-source capacitance of the device can be reduced without significantly impacting the current conduction capability of the source metal, in a way that enables scaling of the device.

Figure 6A:
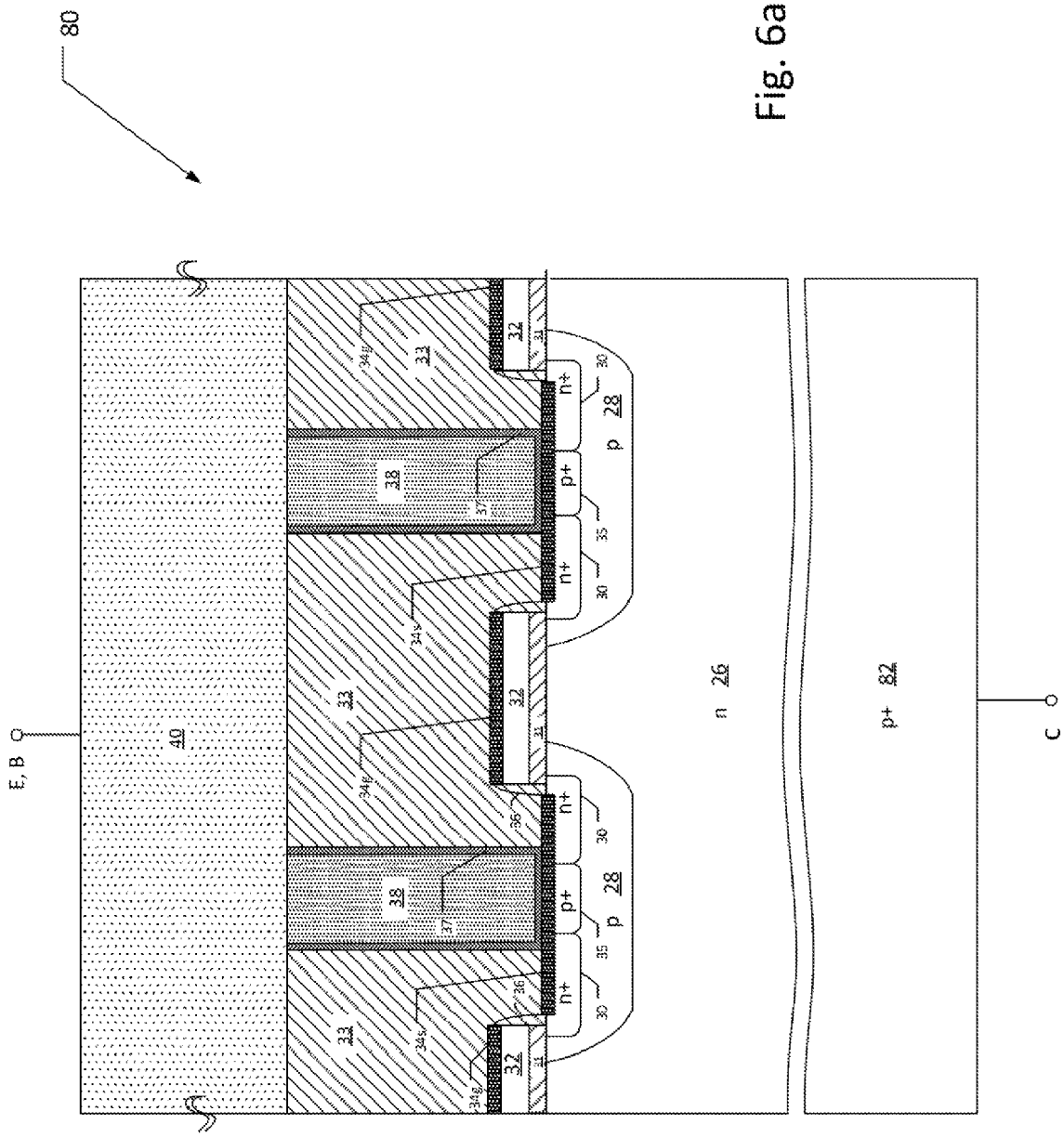
FIG. 6a is a cross-sectional view of a portion of an insulated-gate bipolar transistor (IGBT) constructed according to an embodiment.

It is contemplated that embodiments of this invention may similarly be applied to other vertical power devices including insulated-gate bipolar transistors (IGBTs) and vertical gated power diodes. FIG. 6a illustrates an example of IGBT 80 constructed according to an embodiment, by way of a cross-sectional view similar to that of FIG. 3a for VDMOS 20; similar structural features are shown by the same reference numerals, and will not be further described. In this example, IGBT 80 differs from VDMOS 20 as follows: a) p-pillars do not underlie p-type body regions 28; and b) since vertical IGBT 80 has a p+ collector terminal 82 at the bottom of the semiconductor, IGBT 80 will typically be constructed on bulk (i.e., non-epitaxial) n-type semiconductor substrate 26 (rather than n+ substrate 24 as in the case of VDMOS 20). In this construction, p+ collector 82 is implanted into the bottom-side of the n-type substrate 26 after the fabrication of the top-surface components and after mechanical grinding or chemical etching to thin the substrate; the structure will then be annealed to electrically activate the p+ collector implant. Metal conductor 40 connects p+ region 35 (which provides electrical contact to p-body region 28 as in VDMOS 20) and n+ region 30 (now the emitter of IGBT 80) with gate electrode 32 energized to form a channel. The surface structures of IGBT 80 are otherwise essentially the same as those of VDMOS 20 described above. As in the case of VDMOS 20, IGBT 80 according to this embodiment obtains the advantages of performance, reliability, and scalability discussed above.

Figure 6B:
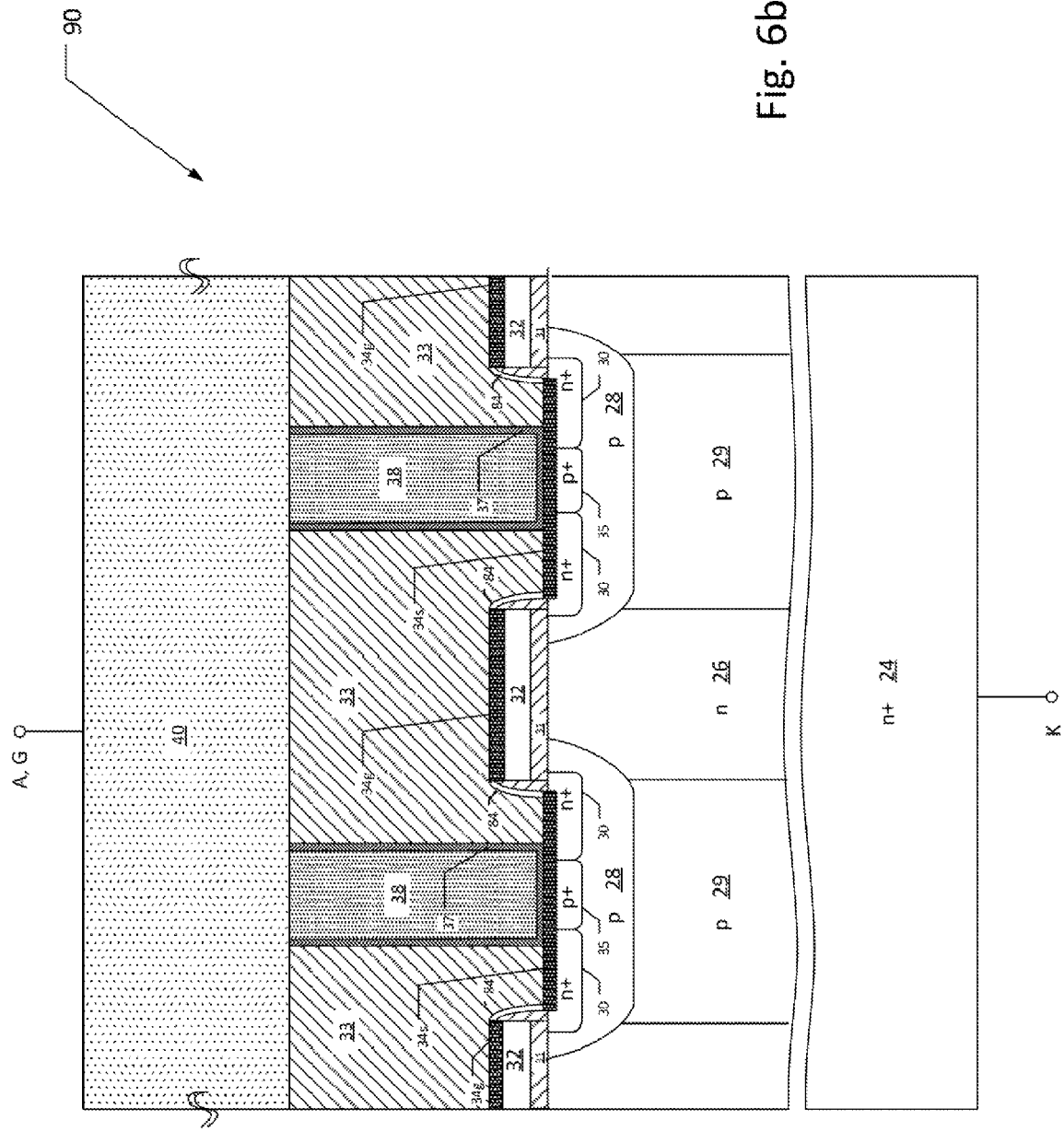
FIG. 6b is a cross-sectional view of a portion of a gated power diode constructed according to an embodiment.

FIG. 6b illustrates the construction of vertical gated diode 90 according to another embodiment; again, similar structures as VDMOS 20 of FIG. 3a are referred to by the same reference numerals. Diode 90 of this embodiment is constructed similarly to VDMOS 20, with n-type epitaxial layer 26 formed on n+ substrate 24 as before, and may or may not include p-type pillars 29 under body regions 28, depending on whether it is desired for diode 90 to employ a charge-balance device construction. N+ substrate 24 provides the cathode connection for diode 90, while metal conductor 40 serves as the anode and gate connection. Vertical diode 90 according to this embodiment differs from VDMOS 20 described above by providing a local connection 84 between gate silicide 34g (and gate electrode 32) and source silicide 34s. According to this embodiment, local connection 84 is obtained by masking portions of the surface of sidewall insulator filaments 36 from the etch used to remove unreacted metal after the direct react silicidation of metal silicide 34s, 34g (i.e., as part of process 66 of FIG. 4). The remaining metal at the masked locations may be either unreacted (e.g., titanium or cobalt metal) or a conductive compound of the silicide metal (e.g., titanium nitride, for the case of titanium metal reacted in a nitrogen atmosphere in the silicidation reaction), or a combination of those conductive species. This local connection 84 enables superior device transient on-turn performance by minimizing the resistance between p+ region 35 and n+ region 30, on one hand, and gate electrode 32, on the other hand. In addition, this construction obtains the advantages of reliability and scalability discussed above in connection with the other embodiments of this invention.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An integrated circuit comprising:
a semiconductor substrate of a first conductivity type;
an epitaxial layer of the first conductivity type overlying the substrate, the epitaxial layer having a lighter dopant concentration than the substrate;
a plurality of gate electrodes disposed near the surface of the epitaxial layer, and spaced apart from one another;
a plurality of body regions of a second conductivity type disposed into the surface of the epitaxial layer at locations between gate electrodes;
within each body region, first and second source regions of the first type conductivity disposed at the surface of the body region;
within each doped region, a body contact region of the second conductivity type disposed at the surface between the first and second source regions;
a metal silicide cladding at the surface of at least a portion of the first and second source regions and the body contact region of each body region;
an insulating layer overlying the gate electrodes, and having a planarized surface;
a plurality of conductive plugs contacting the metal silicide cladding through a contact opening in the insulating layer; and
a metal conductor disposed over the insulating layer and in contact with the plurality of conductive plugs;
wherein the metal silicide cladding is also disposed at a surface of each gate electrode;
further comprising:
a sidewall insulator element disposed along each side of each gate electrode;
a local interconnection disposed on the surface of the sidewall insulator element and making electrical contact between the metal silicide cladding disposed at the gate electrode and the metal silicide cladding disposed at the surface of at least a portion of the first and second source regions and the body contact region.

2. The integrated circuit of claim 1, further comprising:
a plurality of pillars of the second conductivity type, each formed into the epitaxial layer at a location underlying and in contact with one of the body regions.

3. The integrated circuit of claim 1, wherein each of the first and second source regions have an edge that is self-aligned relative to one of the gate electrodes.

4. The integrated circuit of claim 1, further comprising:
a gate dielectric layer disposed between each gate electrode and the surface of the epitaxial layer.

5. The integrated circuit of claim 1, wherein the conductive plug comprises:
one or more layers of barrier metal disposed along the sides and bottom of the contact opening; and
a metal plug disposed adjacent the barrier metal.

6. The integrated circuit of claim 5, wherein the barrier metal comprises titanium and the metal plug comprises tungsten.

7. A method of fabricating a vertical power device, comprising:
forming a plurality of gate electrodes spaced apart from one another near a surface of a semiconductor of a first conductivity type;
forming a plurality of body regions of a second conductivity type at the surface, the plurality of body regions spaced apart from one another by locations of the surface underlying the gate electrodes;
forming, into each body region, first and second source regions of the first conductivity type;
forming, into each body region, a body contact region of the second conductivity type at locations between the first and second source regions;
depositing a metal in contact with the source regions and body contact regions;
then heating the metal to form a metal silicide at the surface of the source regions and body contact regions;
depositing an insulator material overall;
planarizing the insulator material;
forming contact openings through the planarized insulator material;
forming a plurality of conductive plugs in the contact openings to be in electrical contact with the metal silicide at the surface of the source regions and body contact regions; and
then forming a metal conductor in electrical contact with the plurality of conductive plugs;
wherein the step of forming the first and second source regions comprises:
forming a mask feature at a location of each body region between adjacent gate electrodes, exposing surface locations on opposing sides of the mask feature; and
implanting dopant of the first conductivity type into the exposed surface locations of the body regions;
wherein the step of forming the plurality of body contact regions comprises:
after the step of implanting dopant of the first conductivity type, removing the mask feature;
then implanting dopant of the second conductivity type into the body regions; and
then annealing the implanted dopant of the second conductivity type.

8. The method of claim 7, further comprising:
after the step of implanting dopant of the first conductivity type and before the step of forming the body contact regions, implanting dopant of the second conductivity type into the body regions at a dose and energy selected to provide a higher dopant concentration of the second conductivity type within the body regions at locations underlying the source regions.

9. The method of claim 7, wherein the step of forming the body regions comprises:
implanting dopant of the second conductivity type into the surface in a self-aligned manner relative to the gate electrodes; and
then heating the semiconductor;
and further comprising:
after the step of implanting dopant of the first conductivity type, and before the step of forming the body contact regions, forming sidewall insulator filaments on side edges of the gate electrodes.

10. The method of claim 7, further comprising:
prior to the step of forming the body regions, forming an epitaxial layer of the first conductivity type over a substrate of the first conductivity type.

11. The method of claim 7, wherein the step of depositing a metal in contact with the source regions and the body contact regions also deposits the metal in contact with the gate electrodes;
wherein the heating step also forms a metal silicide at the surface of the gate electrodes;
and further comprising:
before the step of depositing a metal in contact with the source regions and body contact regions, forming sidewall insulator elements along sides of the gate electrodes; and
after the heating step, removing the non-silicided metal.

12. The method of claim 7, wherein the step of forming a plurality of conductive plugs comprises:
depositing a barrier metal overall;
depositing a conductive metal overall; and
removing the conductive metal from the surface of the insulating layer, leaving the conductive metal only in the contact openings.

13. The method of claim 12, wherein the barrier metal comprises titanium;
and wherein the conductive metal comprises tungsten.

14. The method of claim 7, wherein the step of forming a metal conductor comprises:
depositing metal overall to a desired thickness of at least about 2 μm and less than about 10 μm; and
removing selected portions of the deposited metal to define one or more metal conductors, each in electrical contact with one or more of the conductive plugs.

15. The method of claim 14, further comprising:
after the step of forming a metal conductor, depositing an insulating passivation layer.

16. The method of claim 7, further comprising:
prior to the step of forming the body regions, forming an epitaxial layer of the first conductivity type over a substrate of the first conductivity type;
wherein the body regions are formed at the surface of the epitaxial layer.

17. The method of claim 16, wherein the step of forming the epitaxial layer comprises:
epitaxially forming a portion of the epitaxial layer;
then implanting a plurality of selected portions of the epitaxial layer with dopant of the second conductivity type; and
repeating the epitaxially forming and implanting steps a plurality of times to form a plurality of pillars of doped material of the second conductivity type within the epitaxial layer of the first conductivity type.

18. A method of fabricating a vertical power device, comprising:
forming a plurality of gate electrodes spaced apart from one another near a surface of a semiconductor of a first conductivity type;
forming a plurality of body regions of a second conductivity type at the surface, the plurality of body regions spaced apart from one another by locations of the surface underlying the gate electrodes;

forming, into each body region, first and second source regions of the first conductivity type;

forming, into each body region, a body contact region of the second conductivity type at locations between the first and second source regions;

depositing a metal in contact with the source regions and body contact regions;

then heating the metal to form a metal silicide at the surface of the source regions and body contact regions;

depositing an insulator material overall;

planarizing the insulator material;

forming contact openings through the planarized insulator material;

forming a plurality of conductive plugs in the contact openings to be in electrical contact with the metal silicide at the surface of the source regions and body contact regions; and then forming a metal conductor in electrical contact with the plurality of conductive plugs;

wherein the step of depositing a metal in contact with the source regions and the body contact regions also deposits the metal in contact with the gate electrodes;

wherein the heating step also forms a metal silicide at the surface of the gate electrodes;

and further comprising:

before the step of depositing a metal in contact with the source regions and body contact regions, forming sidewall insulator elements along sides of the gate electrodes; and after the heating step, removing the non-silicided metal;

after the heating step and before the step of removing the non-silicided metal, masking locations of the non-silicided metal overlying sidewall insulator elements.

* * * * *